(12) United States Patent
Odisho et al.

(10) Patent No.: US 10,908,657 B2
(45) Date of Patent: Feb. 2, 2021

(54) METHODS AND SYSTEMS FOR THERMAL CONTROL

(71) Applicant: Pensando Systems, Inc., San Jose, CA (US)

(72) Inventors: Victor Odisho, San Jose, CA (US); Lin Shen, San Jose, CA (US)

(73) Assignee: PENSANDO SYSTEMS INC., San Jose, CA (US)

( * ) Notice: Subject to any disclaimer, the term of this patent is extended or adjusted under 35 U.S.C. 154(b) by 0 days.

(21) Appl. No.: 16/277,873

(22) Filed: Feb. 15, 2019

(65) Prior Publication Data
US 2020/0264678 A1    Aug. 20, 2020

(51) Int. Cl.
*H05K 7/20*    (2006.01)
*G06F 1/20*    (2006.01)

(52) U.S. Cl.
CPC ............... *G06F 1/20* (2013.01); *H05K 7/205* (2013.01); *H05K 7/20145* (2013.01)

(58) Field of Classification Search
None
See application file for complete search history.

(56) References Cited

U.S. PATENT DOCUMENTS

| | | | |
|---|---|---|---|
| 4,884,631 A | 12/1989 | Rippel et al. | |
| 5,813,243 A | 9/1998 | Johnson et al. | |
| 6,678,157 B1 * | 1/2004 | Bestwick | G06F 1/20 165/104.34 |
| 7,611,402 B2 * | 11/2009 | McClellan | H05K 7/20154 361/679.48 |
| 8,379,384 B2 * | 2/2013 | Smalen | H05K 7/20909 165/104.33 |
| 8,854,807 B2 * | 10/2014 | Hoffmann | H05K 7/20909 165/80.3 |
| 8,913,385 B2 * | 12/2014 | Downing | H01L 23/467 165/104.33 |
| 9,192,079 B2 * | 11/2015 | Loth | H05K 7/20918 |
| 9,526,191 B2 * | 12/2016 | Straznicky | H05K 7/20 |
| 9,622,390 B2 * | 4/2017 | Hwang | H05K 7/20009 |
| 10,334,753 B2 * | 6/2019 | Chu | G06F 1/20 |
| 2003/0002254 A1 | 1/2003 | Faneuf et al. | |
| 2006/0109624 A1 | 5/2006 | Hung | |
| 2007/0133167 A1 | 6/2007 | Wagner et al. | |
| 2011/0110029 A1 | 5/2011 | Lodhia et al. | |
| 2014/0254097 A1 * | 9/2014 | Kohn | G06F 1/181 361/697 |

FOREIGN PATENT DOCUMENTS

WO    WO-2020168167 A1    8/2020

OTHER PUBLICATIONS

PCT/US2020/018250 International Search Report and Written Opinion dated May 11, 2020.

* cited by examiner

*Primary Examiner* — Courtney L Smith
(74) *Attorney, Agent, or Firm* — Wilson Sonsini Goodrich & Rosati

(57) ABSTRACT

Described herein are baffles for Input/Output (I/O) devices and I/O devices comprising baffles configured to redirect incoming pre-heated air around downstream electrical components and/or their respective heat sinks to prevent overheating. Providing an isolated fresh airflow path from a fluid inlet to such downstream electrical devices reducing such overheating, which prevents malfunctions and increases the I/O efficiency, speed, and lifetime of I/O devices.

13 Claims, 33 Drawing Sheets

METHODS AND SYSTEMS FOR THERMAL CONTROL

BACKGROUND

Input/output (I/O) devices allow a computer system to communicate with other computers, a human user, or a storage device. For instance, a keyboard or computer mouse is an input device for a computer, while monitors and printers are output devices. Devices for communication between computers, such as modems and network cards, typically perform both input and output operations. I/O devices may also acquire respective media data as input sent to a computer or send computer data to storage media as storage output.

SUMMARY

In one aspect, disclosed herein is a baffle for redirecting a fluid around an upstream electrical device which emits heat through a downstream electrical device and to an exhaust, the baffle comprising: a first portion comprising a fluid inlet, wherein at least a portion of the fluid inlet is upstream of at least a portion of the upstream electrical device; and a second portion comprising a fluid outlet, wherein at least a portion of the fluid outlet surrounds at least a portion of the downstream electrical device. In some embodiments, the fluid comprises air, a gas, water, or a liquid. In some embodiments, a pressure of the fluid at the fluid inlet is greater than the pressure of the fluid at the fluid outlet.

In some embodiments, a pressure of the fluid at the fluid inlet is greater than the pressure of the fluid at the fluid outlet by about 0.75 iwg to about 3 iwg. In some embodiments, a pressure of the fluid at the fluid inlet is greater than the pressure of the fluid at the fluid outlet by at least about 0.75 iwg. In some embodiments, a pressure of the fluid at the fluid inlet is greater than the pressure of the fluid at the fluid outlet by at most about 3 iwg. In some embodiments, a pressure of the fluid at the fluid inlet is greater than the pressure of the fluid at the fluid outlet by about 0.75 iwg to about 1 iwg, about 0.75 iwg to about 1.25 iwg, about 0.75 iwg to about 1.5 iwg, about 0.75 iwg to about 1.75 iwg, about 0.75 iwg to about 2 iwg, about 0.75 iwg to about 2.25 iwg, about 0.75 iwg to about 2.5 iwg, about 0.75 iwg to about 2.75 iwg, about 0.75 iwg to about 3 iwg, about 1 iwg to about 1.25 iwg, about 1 iwg to about 1.5 iwg, about 1 iwg to about 1.75 iwg, about 1 iwg to about 2 iwg, about 1 iwg to about 2.25 iwg, about 1 iwg to about 2.5 iwg, about 1 iwg to about 2.75 iwg, about 1 iwg to about 3 iwg, about 1.25 iwg to about 1.5 iwg, about 1.25 iwg to about 1.75 iwg, about 1.25 iwg to about 2 iwg, about 1.25 iwg to about 2.25 iwg, about 1.25 iwg to about 2.5 iwg, about 1.25 iwg to about 2.75 iwg, about 1.25 iwg to about 3 iwg, about 1.5 iwg to about 1.75 iwg, about 1.5 iwg to about 2 iwg, about 1.5 iwg to about 2.25 iwg, about 1.5 iwg to about 2.5 iwg, about 1.5 iwg to about 2.75 iwg, about 1.5 iwg to about 3 iwg, about 1.75 iwg to about 2 iwg, about 1.75 iwg to about 2.25 iwg, about 1.75 iwg to about 2.5 iwg, about 1.75 iwg to about 2.75 iwg, about 1.75 iwg to about 3 iwg, about 2 iwg to about 2.25 iwg, about 2 iwg to about 2.5 iwg, about 2 iwg to about 2.75 iwg, about 2 iwg to about 3 iwg, about 2.25 iwg to about 2.5 iwg, about 2.25 iwg to about 2.75 iwg, about 2.25 iwg to about 3 iwg, about 2.5 iwg to about 2.75 iwg, about 2.5 iwg to about 3 iwg, or about 2.75 iwg to about 3 iwg. In various embodiments, a pressure of the fluid at the fluid inlet is greater than the pressure of the fluid at the fluid outlet by about 0.75 iwg, about 1 iwg, about 1.25 iwg, about 1.5 iwg, about 1.75 iwg, about 2 iwg, about 2.25 iwg, about 2.5 iwg, about 2.75 iwg, or about 3 iwg, including increments therein.

In some embodiments, the first portion is offset from the second portion in one or more directions. In some embodiments, an interior of at least one of the first portion and the second portion comprises a fluid redirection fin.

In some embodiments, a temperature of the fluid at the fluid inlet is about 25° C. to about 75° C. In some embodiments, a temperature of the fluid at the fluid inlet is at least about 25° C. In some embodiments, a temperature of the fluid at the fluid inlet is at most about 75° C. In some embodiments, a temperature of the fluid at the fluid inlet is about 25° C. to about 30° C., about 25° C. to about 35° C., about 25° C. to about 40° C., about 25° C. to about 45° C., about 25° C. to about 50° C., about 25° C. to about 55° C., about 25° C. to about 60° C., about 25° C. to about 65° C., about 25° C. to about 70° C., about 25° C. to about 75° C., about 30° C. to about 35° C., about 30° C. to about 40° C., about 30° C. to about 45° C., about 30° C. to about 50° C., about 30° C. to about 55° C., about 30° C. to about 60° C., about 30° C. to about 65° C., about 30° C. to about 70° C., about 30° C. to about 75° C., about 35° C. to about 40° C., about 35° C. to about 45° C., about 35° C. to about 50° C., about 35° C. to about 55° C., about 35° C. to about 60° C., about 35° C. to about 65° C., about 35° C. to about 70° C., about 35° C. to about 75° C., about 40° C. to about 45° C., about 40° C. to about 50° C., about 40° C. to about 55° C., about 40° C. to about 60° C., about 40° C. to about 65° C., about 40° C. to about 70° C., about 40° C. to about 75° C., about 45° C. to about 50° C., about 45° C. to about 55° C., about 45° C. to about 60° C., about 45° C. to about 65° C., about 45° C. to about 70° C., about 45° C. to about 75° C., about 50° C. to about 55° C., about 50° C. to about 60° C., about 50° C. to about 65° C., about 50° C. to about 70° C., about 50° C. to about 75° C., about 55° C. to about 60° C., about 55° C. to about 65° C., about 55° C. to about 70° C., about 55° C. to about 75° C., about 60° C. to about 65° C., about 60° C. to about 70° C., about 60° C. to about 75° C., about 65° C. to about 70° C., about 65° C. to about 75° C., or about 70° C. to about 75° C. In various embodiments, a temperature of the fluid at the fluid inlet is about 25° C., about 30° C., about 35° C., about 40° C., about 45° C., about 50° C., about 55° C., about 60° C., about 65° C., about 70° C., or about 75° C., including increments therein.

In some embodiments, an upper surface of the first portion, the second portion or both, comprises a perforation. In some embodiments, an upper surface of the first portion, the second portion or both, is removable.

In some embodiments, a ratio between an area of the fluid inlet and an area of the fluid outlet is about 0.1:1 to about 10:1. In some embodiments, a ratio between an area of the fluid inlet and an area of the fluid outlet is at least about 0.1:1. In some embodiments, a ratio between an area of the fluid inlet and an area of the fluid outlet is at most about 10:1. In some embodiments, a ratio between an area of the fluid inlet and an area of the fluid outlet is about 0.1:1 to about 0.5:1, about 0.1:1 to about 1:1, about 0.1:1 to about 1.5:1, about 0.1:1 to about 2:1, about 0.1:1 to about 3:1, about 0.1:1 to about 4:1, about 0.1:1 to about 5:1, about 0.1:1 to about 6:1, about 0.1:1 to about 7:1, about 0.1:1 to about 8:1, about 0.1:1 to about 10:1, about 0.5:1 to about 1:1, about 0.5:1 to about 1.5:1, about 0.5:1 to about 2:1, about 0.5:1 to about 3:1, about 0.5:1 to about 4:1, about 0.5:1 to about 5:1, about 0.5:1 to about 6:1, about 0.5:1 to about 7:1, about 0.5:1 to about 8:1, about 0.5:1 to about 10:1, about 1:1 to about 1.5:1, about 1:1 to about 2:1, about 1:1 to about 3:1, about 1:1 to about 4:1, about 1:1 to about 5:1, about 1:1 to about 6:1, about 1:1 to about 7:1, about 1:1 to about 8:1, about 1:1 to about 10:1, about 1.5:1 to about 2:1, about 1.5:1 to about 3:1, about 1.5:1 to about 4:1, about 1.5:1 to about 5:1, about 1.5:1 to about 6:1, about 1.5:1 to about 7:1, about 1.5:1 to about 8:1, about 1.5:1 to about 10:1, about 2:1 to about 3:1, about 2:1 to about 4:1, about 2:1 to about 5:1, about 2:1 to about 6:1, about 2:1 to about 7:1, about 2:1 to about 8:1, about 2:1 to about 10:1, about 3:1 to about 4:1, about 3:1 to about 5:1, about 3:1 to about 6:1, about 3:1 to about 7:1, about 3:1 to about 8:1, about 3:1 to about 10:1, about 4:1 to about 5:1, about 4:1 to about 6:1, about 4:1 to about 7:1, about 4:1 to about 8:1, about 4:1 to about 10:1, about 5:1 to about 6:1, about 5:1 to about 7:1, about 5:1 to about 8:1, about 5:1 to about 10:1, about 6:1 to about 7:1, about 6:1 to about 8:1, about 6:1 to about 10:1, about 7:1 to about 8:1, about 7:1 to about 10:1, or about 8:1 to about 10:1. In various embodiments, a ratio between an area of the fluid inlet and an area of the fluid outlet is about 0.1:1, about 0.5:1, about 1:1, about 1.5:1, about 2:1, about 3:1, about 4:1, about 5:1, about 6:1, about 7:1, about 8:1, or about 10:1, including increments therein.

In some embodiments, a ratio of a volume of the first portion and a volume of the second portion is about 0.1:1 to about 10:1. In some embodiments, a ratio of a volume of the first portion and a volume of the second portion is at least about 0.1:1. In some embodiments, a ratio of a volume of the first portion and a volume of the second portion is at most about 10:1. In some embodiments, a ratio of a volume of the first portion and a volume of the second portion is about 0.1:1 to about 0.5:1, about 0.1:1 to about 1:1, about 0.1:1 to about 1.5:1, about 0.1:1 to about 2:1, about 0.1:1 to about 3:1, about 0.1:1 to about 4:1, about 0.1:1 to about 5:1, about 0.1:1 to about 6:1, about 0.1:1 to about 7:1, about 0.1:1 to about 8:1, about 0.1:1 to about 10:1, about 0.5:1 to about 1:1, about 0.5:1 to about 1.5:1, about 0.5:1 to about 2:1, about 0.5:1 to about 3:1, about 0.5:1 to about 4:1, about 0.5:1 to about 5:1, about 0.5:1 to about 6:1, about 0.5:1 to about 7:1, about 0.5:1 to about 8:1, about 0.5:1 to about 10:1, about 1:1 to about 1.5:1, about 1:1 to about 2:1, about 1:1 to about 3:1, about 1:1 to about 4:1, about 1:1 to about 5:1, about 1:1 to about 6:1, about 1:1 to about 7:1, about 1:1 to about 8:1, about 1:1 to about 10:1, about 1.5:1 to about 2:1, about 1.5:1 to about 3:1, about 1.5:1 to about 4:1, about 1.5:1 to about 5:1, about 1.5:1 to about 6:1, about 1.5:1 to about 7:1, about 1.5:1 to about 8:1, about 1.5:1 to about 10:1, about 2:1 to about 3:1, about 2:1 to about 4:1, about 2:1 to about 5:1, about 2:1 to about 6:1, about 2:1 to about 7:1, about 2:1 to about 8:1, about 2:1 to about 10:1, about 3:1 to about 4:1, about 3:1 to about 5:1, about 3:1 to about 6:1, about 3:1 to about 7:1, about 3:1 to about 8:1, about 3:1 to about 10:1, about 4:1 to about 5:1, about 4:1 to about 6:1, about 4:1 to about 7:1, about 4:1 to about 8:1, about 4:1 to about 10:1, about 5:1 to about 6:1, about 5:1 to about 7:1, about 5:1 to about 8:1, about 5:1 to about 10:1, about 6:1 to about 7:1, about 6:1 to about 8:1, about 6:1 to about 10:1, about 7:1 to about 8:1, about 7:1 to about 10:1, or about 8:1 to about 10:1. In various embodiments, a ratio of a volume of the first portion and a volume of the second portion is about 0.1:1, about 0.5:1, about 1:1, about 1.5:1, about 2:1, about 3:1, about 4:1, about 5:1, about 6:1, about 7:1, about 8:1, or about 10:1, including increments therein.

In some embodiments, a ratio between a height of the fluid inlet and a height of the fluid outlet is about 0.1:1 to about 10:1. In some embodiments, a ratio between a height of the fluid inlet and a height of the fluid outlet is at least about 0.1:1. In some embodiments, a ratio between a height of the fluid inlet and a height of the fluid outlet is at most about 10:1. In some embodiments, a ratio between a height of the fluid inlet and a height of the fluid outlet is about 0.1:1 to about 0.5:1, about 0.1:1 to about 1:1, about 0.1:1 to about 1.5:1, about 0.1:1 to about 2:1, about 0.1:1 to about 3:1, about 0.1:1 to about 4:1, about 0.1:1 to about 5:1, about 0.1:1 to about 6:1, about 0.1:1 to about 7:1, about 0.1:1 to about 8:1, about 0.1:1 to about 10:1, about 0.5:1 to about 1:1, about 0.5:1 to about 1.5:1, about 0.5:1 to about 2:1, about 0.5:1 to about 3:1, about 0.5:1 to about 4:1, about 0.5:1 to about 5:1, about 0.5:1 to about 6:1, about 0.5:1 to about 7:1, about 0.5:1 to about 8:1, about 0.5:1 to about 10:1, about 1:1 to about 1.5:1, about 1:1 to about 2:1, about 1:1 to about 3:1, about 1:1 to about 4:1, about 1:1 to about 5:1, about 1:1 to about 6:1, about 1:1 to about 7:1, about 1:1 to about 8:1, about 1:1 to about 10:1, about 1.5:1 to about 2:1, about 1.5:1 to about 3:1, about 1.5:1 to about 4:1, about 1.5:1 to about 5:1, about 1.5:1 to about 6:1, about 1.5:1 to about 7:1, about 1.5:1 to about 8:1, about 1.5:1 to about 10:1, about 2:1 to about 3:1, about 2:1 to about 4:1, about 2:1 to about 5:1, about 2:1 to about 6:1, about 2:1 to about 7:1, about 2:1 to about 8:1, about 2:1 to about 10:1, about 3:1 to about 4:1, about 3:1 to about 5:1, about 3:1 to about 6:1, about 3:1 to about 7:1, about 3:1 to about 8:1, about 3:1 to about 10:1, about 4:1 to about 5:1, about 4:1 to about 6:1, about 4:1 to about 7:1, about 4:1 to about 8:1, about 4:1 to about 10:1, about 5:1 to about 6:1, about 5:1 to about 7:1, about 5:1 to about 8:1, about 5:1 to about 10:1, about 6:1 to about 7:1, about 6:1 to about 8:1, about 6:1 to about 10:1, about 7:1 to about 8:1, about 7:1 to about 10:1, or about 8:1 to about 10:1. In various embodiments, a ratio between a height of the fluid inlet and a height of the fluid outlet is about 0.1:1, about 0.5:1, about 1:1, about 1.5:1, about 2:1, about 3:1, about 4:1, about 5:1, about 6:1, about 7:1, about 8:1, or about 10:1, including increments therein.

Another aspect provided herein is an input/output (I/O) device comprising: an upstream electrical device that emits heat; a downstream electrical device having a downstream electrical device; and a baffle for redirecting a fluid around the upstream electrical device through the downstream electrical device and to an exhaust, the baffle comprising: a first portion comprising a fluid inlet, wherein at least a portion of the fluid inlet is upstream of the upstream electrical device; and a second portion comprising a fluid outlet, wherein at least a portion of the fluid outlet surrounds at least a portion of the downstream electrical device. In some embodiments, wherein the fluid comprises air, a gas, water, or a liquid. In some embodiments, a pressure of the fluid at the fluid inlet is greater than the pressure of the fluid at the fluid outlet.

In some embodiments, a pressure of the fluid at the fluid inlet is greater than the pressure of the fluid at the fluid outlet by about 0.75 iwg to about 3 iwg. In some embodiments, a pressure of the fluid at the fluid inlet is greater than the pressure of the fluid at the fluid outlet by at least about 0.75 iwg. In some embodiments, a pressure of the fluid at the fluid inlet is greater than the pressure of the fluid at the fluid outlet by at most about 3 iwg. In some embodiments, a pressure of the fluid at the fluid inlet is greater than the pressure of the fluid at the fluid outlet by about 0.75 iwg to about 1 iwg, about 0.75 iwg to about 1.25 iwg, about 0.75 iwg to about 1.5 iwg, about 0.75 iwg to about 1.75 iwg, about 0.75 iwg to about 2 iwg, about 0.75 iwg to about 2.25 iwg, about 0.75 iwg to about 2.5 iwg, about 0.75 iwg to about 2.75 iwg, about 0.75 iwg to about 3 iwg, about 1 iwg to about 1.25 iwg, about 1 iwg to about 1.5 iwg, about 1 iwg to about 1.75 iwg, about 1 iwg to about 2 iwg, about 1 iwg to about 2.25 iwg, about 1 iwg to about 2.5 iwg, about 1 iwg to about 2.75 iwg, about 1 iwg to about 3 iwg, about 1.25 iwg to about 1.5 iwg, about 1.25 iwg to about 1.75 iwg, about 1.25 iwg to about 2 iwg, about 1.25 iwg to about 2.25 iwg, about 1.25 iwg to about 2.5 iwg, about 1.25 iwg to about 2.75 iwg, about 1.25 iwg to about 3 iwg, about 1.5 iwg to about 1.75 iwg, about 1.5 iwg to about 2 iwg, about 1.5 iwg to about 2.25 iwg, about 1.5 iwg to about 2.5 iwg, about 1.5 iwg to about 2.75 iwg, about 1.5 iwg to about 3 iwg, about 1.75 iwg to about 2 iwg, about 1.75 iwg to about 2.25 iwg, about 1.75 iwg to about 2.5 iwg, about 1.75 iwg to about 2.75 iwg, about 1.75 iwg to about 3 iwg, about 2 iwg to about 2.25 iwg, about 2 iwg to about 2.5 iwg, about 2 iwg to about 2.75 iwg, about 2 iwg to about 3 iwg, about 2.25 iwg to about 2.5 iwg, about 2.25 iwg to about 2.75 iwg, about 2.25 iwg to about 3 iwg, about 2.5 iwg to about 2.75 iwg, about 2.5 iwg to about 3 iwg, or about 2.75 iwg to about 3 iwg. In various embodiments, a pressure of the fluid at the fluid inlet is greater than the pressure of the fluid at the fluid outlet by about 0.75 iwg, about 1 iwg, about 1.25 iwg, about 1.5 iwg, about 1.75 iwg, about 2 iwg, about 2.25 iwg, about 2.5 iwg, about 2.75 iwg, or about 3 iwg, including increments therein.

In some embodiments, the first portion is offset from the second portion in one or more directions. In some embodiments, an interior of at least one of the first portion and the second portion comprises a fluid redirection fin.

In some embodiments, a temperature of the fluid at the fluid inlet is about 25° C. to about 75° C. In some embodiments, a temperature of the fluid at the fluid inlet is at least about 25° C. In some embodiments, a temperature of the fluid at the fluid inlet is at most about 75° C. In some embodiments, a temperature of the fluid at the fluid inlet is about 25° C. to about 30° C., about 25° C. to about 35° C., about 25° C. to about 40° C., about 25° C. to about 45° C., about 25° C. to about 50° C., about 25° C. to about 55° C., about 25° C. to about 60° C., about 25° C. to about 65° C., about 25° C. to about 70° C., about 25° C. to about 75° C., about 30° C. to about 35° C., about 30° C. to about 40° C., about 30° C. to about 45° C., about 30° C. to about 50° C., about 30° C. to about 55° C., about 30° C. to about 60° C., about 30° C. to about 65° C., about 30° C. to about 70° C., about 30° C. to about 75° C., about 35° C. to about 40° C., about 35° C. to about 45° C., about 35° C. to about 50° C., about 35° C. to about 55° C., about 35° C. to about 60° C., about 35° C. to about 65° C., about 35° C. to about 70° C., about 35° C. to about 75° C., about 40° C. to about 45° C., about 40° C. to about 50° C., about 40° C. to about 55° C., about 40° C. to about 60° C., about 40° C. to about 65° C., about 40° C. to about 70° C., about 40° C. to about 75° C., about 45° C. to about 50° C., about 45° C. to about 55° C., about 45° C. to about 60° C., about 45° C. to about 65° C., about 45° C. to about 70° C., about 45° C. to about 75° C., about 50° C. to about 55° C., about 50° C. to about 60° C., about 50° C. to about 65° C., about 50° C. to about 70° C., about 50° C. to about 75° C., about 55° C. to about 60° C., about 55° C. to about 65° C., about 55° C. to about 70° C., about 55° C. to about 75° C., about 60° C. to about 65° C., about 60° C. to about 70° C., about 60° C. to about 75° C., about 65° C. to about 70° C., about 65° C. to about 75° C., or about 70° C. to about 75° C. In various embodiments, a temperature of the fluid at the fluid inlet is about 25° C., about 30° C., about 35° C., about 40° C., about 45° C., about 50° C., about 55° C., about 60° C., about 65° C., about 70° C., or about 75° C., including increments therein.

In some embodiments, an upper surface of the first portion, the second portion or both, comprises a perforation.

In some embodiments, an upper surface of the first portion, the second portion or both, is removable.

In some embodiments, a ratio between an area of the fluid inlet and an area of the fluid outlet is about 0.1:1 to about 10:1. In some embodiments, a ratio between an area of the fluid inlet and an area of the fluid outlet is at least about 0.1:1. In some embodiments, a ratio between an area of the fluid inlet and an area of the fluid outlet is at most about 10:1. In some embodiments, a ratio between an area of the fluid inlet and an area of the fluid outlet is about 0.1:1 to about 0.5:1, about 0.1:1 to about 1:1, about 0.1:1 to about 1.5:1, about 0.1:1 to about 2:1, about 0.1:1 to about 3:1, about 0.1:1 to about 4:1, about 0.1:1 to about 5:1, about 0.1:1 to about 6:1, about 0.1:1 to about 7:1, about 0.1:1 to about 8:1, about 0.1:1 to about 10:1, about 0.5:1 to about 1:1, about 0.5:1 to about 1.5:1, about 0.5:1 to about 2:1, about 0.5:1 to about 3:1, about 0.5:1 to about 4:1, about 0.5:1 to about 5:1, about 0.5:1 to about 6:1, about 0.5:1 to about 7:1, about 0.5:1 to about 8:1, about 0.5:1 to about 10:1, about 1:1 to about 1.5:1, about 1:1 to about 2:1, about 1:1 to about 3:1, about 1:1 to about 4:1, about 1:1 to about 5:1, about 1:1 to about 6:1, about 1:1 to about 7:1, about 1:1 to about 8:1, about 1:1 to about 10:1, about 1.5:1 to about 2:1, about 1.5:1 to about 3:1, about 1.5:1 to about 4:1, about 1.5:1 to about 5:1, about 1.5:1 to about 6:1, about 1.5:1 to about 7:1, about 1.5:1 to about 8:1, about 1.5:1 to about 10:1, about 2:1 to about 3:1, about 2:1 to about 4:1, about 2:1 to about 5:1, about 2:1 to about 6:1, about 2:1 to about 7:1, about 2:1 to about 8:1, about 2:1 to about 10:1, about 3:1 to about 4:1, about 3:1 to about 5:1, about 3:1 to about 6:1, about 3:1 to about 7:1, about 3:1 to about 8:1, about 3:1 to about 10:1, about 4:1 to about 5:1, about 4:1 to about 6:1, about 4:1 to about 7:1, about 4:1 to about 8:1, about 4:1 to about 10:1, about 5:1 to about 6:1, about 5:1 to about 7:1, about 5:1 to about 8:1, about 5:1 to about 10:1, about 6:1 to about 7:1, about 6:1 to about 8:1, about 6:1 to about 10:1, about 7:1 to about 8:1, about 7:1 to about 10:1, or about 8:1 to about 10:1. In various embodiments, a ratio between an area of the fluid inlet and an area of the fluid outlet is about 0.1:1, about 0.5:1, about 1:1, about 1.5:1, about 2:1, about 3:1, about 4:1, about 5:1, about 6:1, about 7:1, about 8:1, or about 10:1, including increments therein.

In some embodiments, a ratio of a volume the first portion and a volume the second portion is about 0.1:1 to about 10:1. In some embodiments, a ratio of a volume the first portion and a volume the second portion is at least about 0.1:1. In some embodiments, a ratio of a volume the first portion and a volume the second portion is at most about 10:1. In some embodiments, a ratio of a volume the first portion and a volume the second portion is about 0.1:1 to about 0.5:1, about 0.1:1 to about 1:1, about 0.1:1 to about 1.5:1, about 0.1:1 to about 2:1, about 0.1:1 to about 3:1, about 0.1:1 to about 4:1, about 0.1:1 to about 5:1, about 0.1:1 to about 6:1, about 0.1:1 to about 7:1, about 0.1:1 to about 8:1, about 0.1:1 to about 10:1, about 0.5:1 to about 1:1, about 0.5:1 to about 1.5:1, about 0.5:1 to about 2:1, about 0.5:1 to about 3:1, about 0.5:1 to about 4:1, about 0.5:1 to about 5:1, about 0.5:1 to about 6:1, about 0.5:1 to about 7:1, about 0.5:1 to about 8:1, about 0.5:1 to about 10:1, about 1:1 to about 1.5:1, about 1:1 to about 2:1, about 1:1 to about 3:1, about 1:1 to about 4:1, about 1:1 to about 5:1, about 1:1 to about 6:1, about 1:1 to about 7:1, about 1:1 to about 8:1, about 1:1 to about 10:1, about 1.5:1 to about 2:1, about 1.5:1 to about 3:1, about 1.5:1 to about 4:1, about 1.5:1 to about 5:1, about 1.5:1 to about 6:1, about 1.5:1 to about 7:1, about 1.5:1 to about 8:1, about 1.5:1 to about 10:1, about 2:1 to about 3:1, about 2:1 to about 4:1, about 2:1 to about 5:1, about 2:1 to about 6:1, about 2:1 to about 7:1, about 2:1 to about 8:1, about 2:1 to about 10:1, about 3:1 to about 4:1, about 3:1 to about 5:1, about 3:1 to about 6:1, about 3:1 to about 7:1, about 3:1 to about 8:1, about 3:1 to about 10:1, about 4:1 to about 5:1, about 4:1 to about 6:1, about 4:1 to about 7:1, about 4:1 to about 8:1, about 4:1 to about 10:1, about 5:1 to about 6:1, about 5:1 to about 7:1, about 5:1 to about 8:1, about 5:1 to about 10:1, about 6:1 to about 7:1, about 6:1 to about 8:1, about 6:1 to about 10:1, about 7:1 to about 8:1, about 7:1 to about 10:1, or about 8:1 to about 10:1. In various embodiments, a ratio of a volume the first portion and a volume the second portion is about 0.1:1, about 0.5:1, about 1:1, about 1.5:1, about 2:1, about 3:1, about 4:1, about 5:1, about 6:1, about 7:1, about 8:1, or about 10:1, including increments therein.

In some embodiments, a ratio between a height of the fluid inlet and a height of the fluid outlet is about 0.1:1 to about 10:1. In some embodiments, a ratio between a height of the fluid inlet and a height of the fluid outlet is at least about 0.1:1. In some embodiments, a ratio between a height of the fluid inlet and a height of the fluid outlet is at most about 10:1. In some embodiments, a ratio between a height of the fluid inlet and a height of the fluid outlet is about 0.1:1 to about 0.5:1, about 0.1:1 to about 1:1, about 0.1:1 to about 1.5:1, about 0.1:1 to about 2:1, about 0.1:1 to about 3:1, about 0.1:1 to about 4:1, about 0.1:1 to about 5:1, about 0.1:1 to about 6:1, about 0.1:1 to about 7:1, about 0.1:1 to about 8:1, about 0.1:1 to about 10:1, about 0.5:1 to about 1:1, about 0.5:1 to about 1.5:1, about 0.5:1 to about 2:1, about 0.5:1 to about 3:1, about 0.5:1 to about 4:1, about 0.5:1 to about 5:1, about 0.5:1 to about 6:1, about 0.5:1 to about 7:1, about 0.5:1 to about 8:1, about 0.5:1 to about 10:1, about 1:1 to about 1.5:1, about 1:1 to about 2:1, about 1:1 to about 3:1, about 1:1 to about 4:1, about 1:1 to about 5:1, about 1:1 to about 6:1, about 1:1 to about 7:1, about 1:1 to about 8:1, about 1:1 to about 10:1, about 1.5:1 to about 2:1, about 1.5:1 to about 3:1, about 1.5:1 to about 4:1, about 1.5:1 to about 5:1, about 1.5:1 to about 6:1, about 1.5:1 to about 7:1, about 1.5:1 to about 8:1, about 1.5:1 to about 10:1, about 2:1 to about 3:1, about 2:1 to about 4:1, about 2:1 to about 5:1, about 2:1 to about 6:1, about 2:1 to about 7:1, about 2:1 to about 8:1, about 2:1 to about 10:1, about 3:1 to about 4:1, about 3:1 to about 5:1, about 3:1 to about 6:1, about 3:1 to about 7:1, about 3:1 to about 8:1, about 3:1 to about 10:1, about 4:1 to about 5:1, about 4:1 to about 6:1, about 4:1 to about 7:1, about 4:1 to about 8:1, about 4:1 to about 10:1, about 5:1 to about 6:1, about 5:1 to about 7:1, about 5:1 to about 8:1, about 5:1 to about 10:1, about 6:1 to about 7:1, about 6:1 to about 8:1, about 6:1 to about 10:1, about 7:1 to about 8:1, about 7:1 to about 10:1, or about 8:1 to about 10:1. In various embodiments, a ratio between a height of the fluid inlet and a height of the fluid outlet is about 0.1:1, about 0.5:1, about 1:1, about 1.5:1, about 2:1, about 3:1, about 4:1, about 5:1, about 6:1, about 7:1, about 8:1, or about 10:1, including increments therein.

BRIEF DESCRIPTION OF THE DRAWINGS

The novel features of the disclosure are set forth with particularity in the appended claims. A better understanding of the features and advantages of the present disclosure will be obtained by reference to the following detailed description that sets forth illustrative embodiments, in which the principles of the disclosure are utilized, and the accompanying drawings of which:

DETAILED DESCRIPTION

I/O Devices

Figure 1:
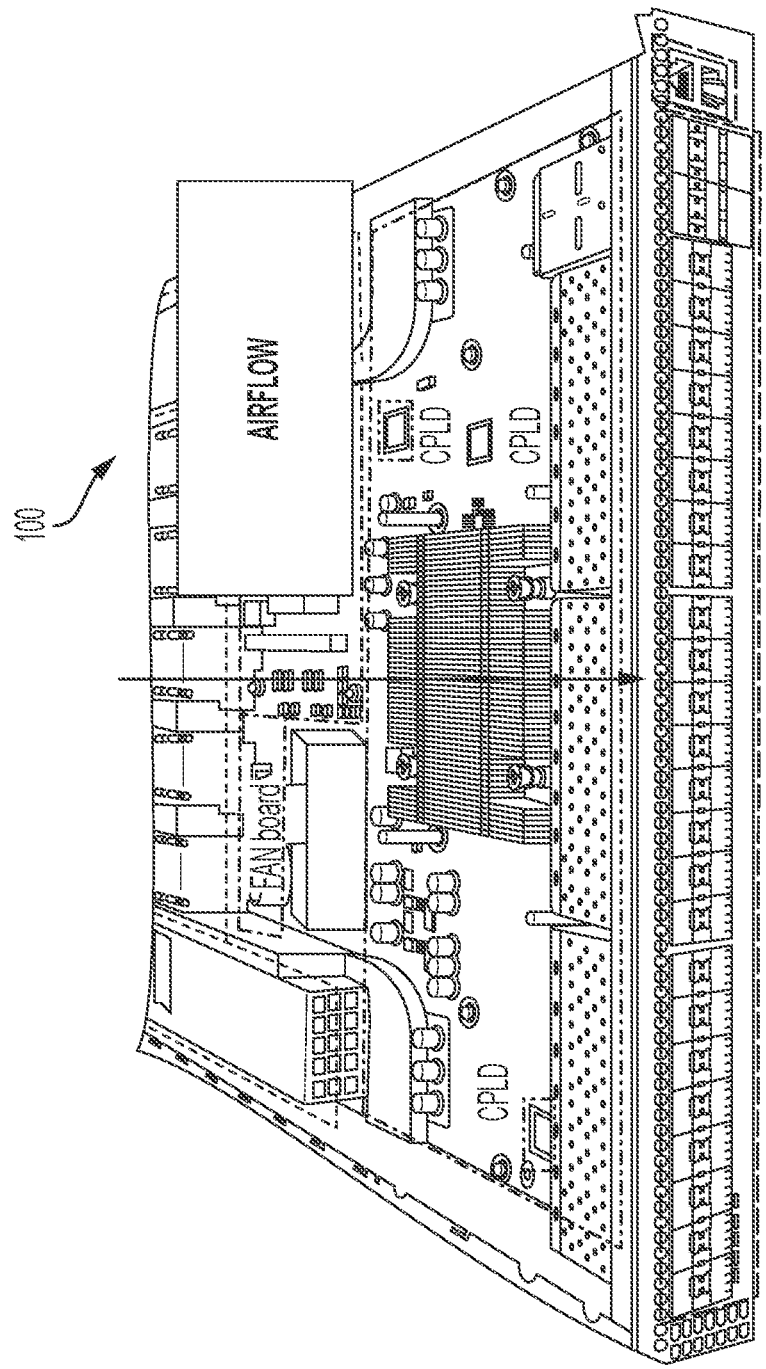
FIG. 1 shows a top front perspective view image of an exemplary upstream electrical device and an exemplary downstream electrical device, per an embodiment herein.
Figure 2:
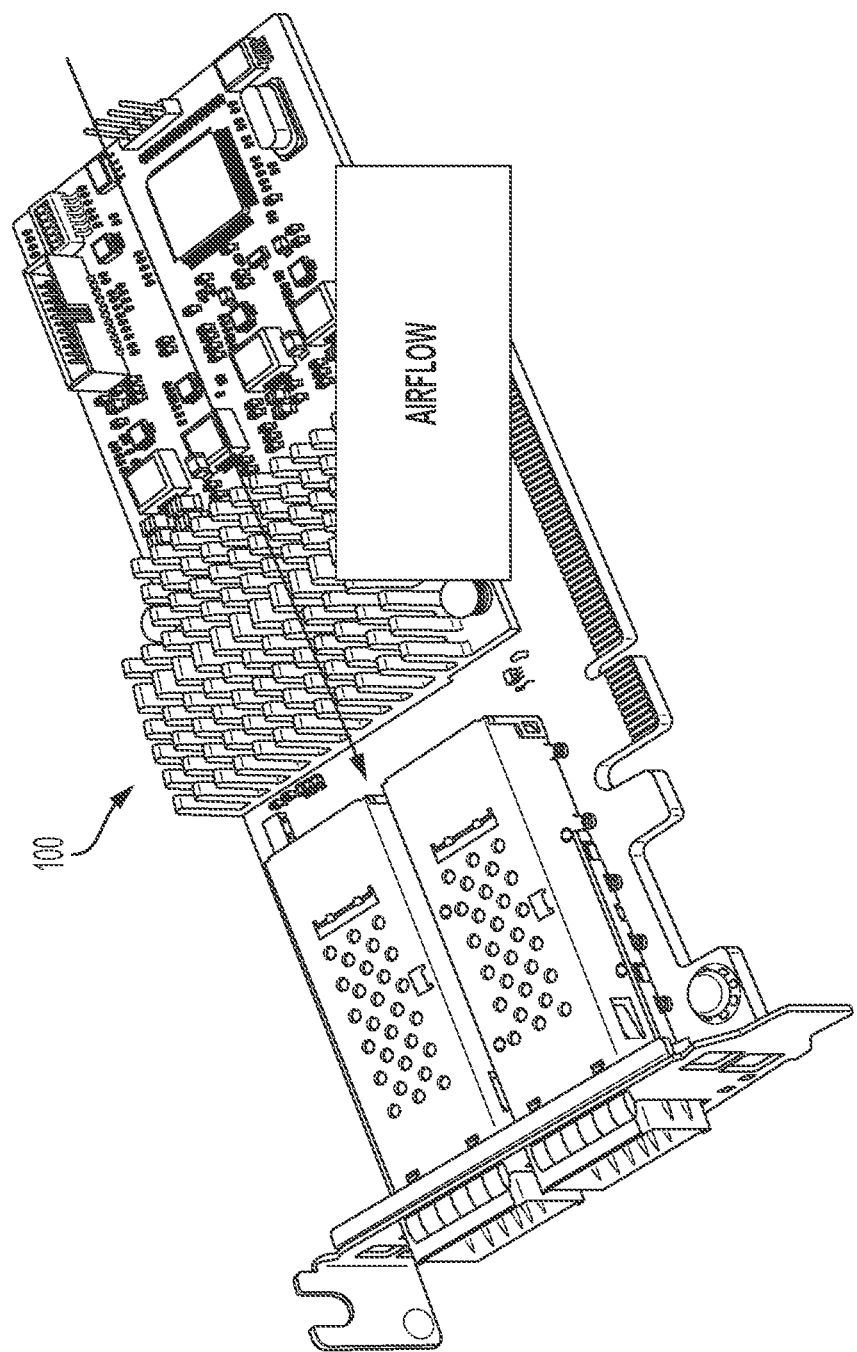
FIG. 2 shows a top front right perspective view image of an exemplary upstream electrical device and an exemplary downstream electrical device, per an embodiment herein.

Provided herein are input/output (I/O) devices and baffles for I/O devices. An I/O device is any computer or computing hardware configured to receive an input and transmit an output. As seen in FIGS. 1-2 each I/O device 100 may comprise a plurality of electrical components. Some of the electrical components may release heat as a side-effect of energy transfer. Further, some of the electrical components may comprise a heat sink configured to shed such heat from the electrical component to improve efficiency and lifecycle. However, as I/O devices 100 may also receive and exhaust hot air warmed by the upstream I/O electrical devices and components within a computer, the efficacy of such heat sinks on downstream I/O electrical components is often greatly reduced. As such, there is a current unmet need for a baffle configured to redirect incoming pre-heated air around downstream electrical components and/or their respective heat sinks to improve the efficiency, speed, and lifetime of I/O devices 100.

For instance, an I/O device 100 may comprise a high speed optical interconnect device. As high speed optical interconnect devices are typically located far-end of the airflow path, incoming air preheated by high power upstream chips and devices may exceed the maximum working temperature of the interconnect device of about 70° C. Such overheating, in turn, may cause malfunctions or reduced lifecycle. Thus, in this example, an air baffle may be used to establish an isolated fresh airflow path from a fluid inlet to the high speed optical interconnect device for proper cooling.

Baffles

Provided herein, per FIGS. 3-15 is a baffle 310 for redirecting a fluid 301 around an upstream electrical device 320 to a downstream electrical device 330 and to an exhaust. At least one of the upstream electrical device 320 and the downstream electrical device 330 may comprise a heatsink.

The baffle 310 may be formed of any material capable of withstanding temperatures of up to about 70° C., 80° C., 90° C., 100° C., 120° C., 140° C., 160° C., 180° C., or more including increments therein without permanently deforming. The baffle 310 may be formed of plastic, wood, metal, ceramic, glass, fiberglass, carbon fiber, or any combination thereof. The plastic may comprise Polysulfone (PSU), poly (ethersulfone) (PES) polyetherimide (PEI), poly(phenylene sulfide) (PPS), polyetheretherketone (PEEK), polyether ketones (PEK), or any combination thereof.

Figure 3:
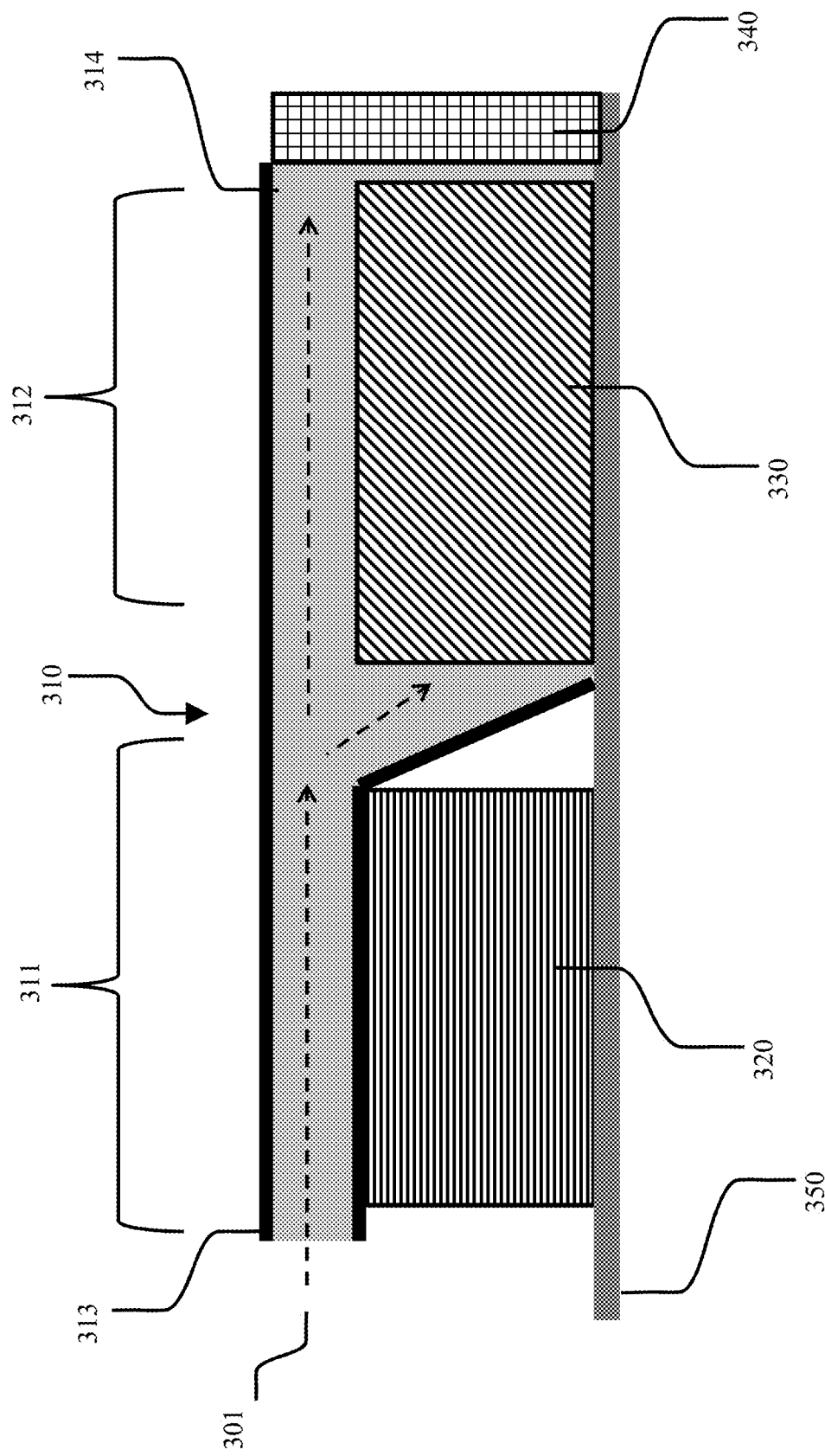
FIG. 3 shows a cross-sectional right side view schematic illustration of an exemplary baffle for redirecting a fluid around an upstream electrical device, through a downstream electrical device, and to an exhaust, per an embodiment herein.
Figure 6:
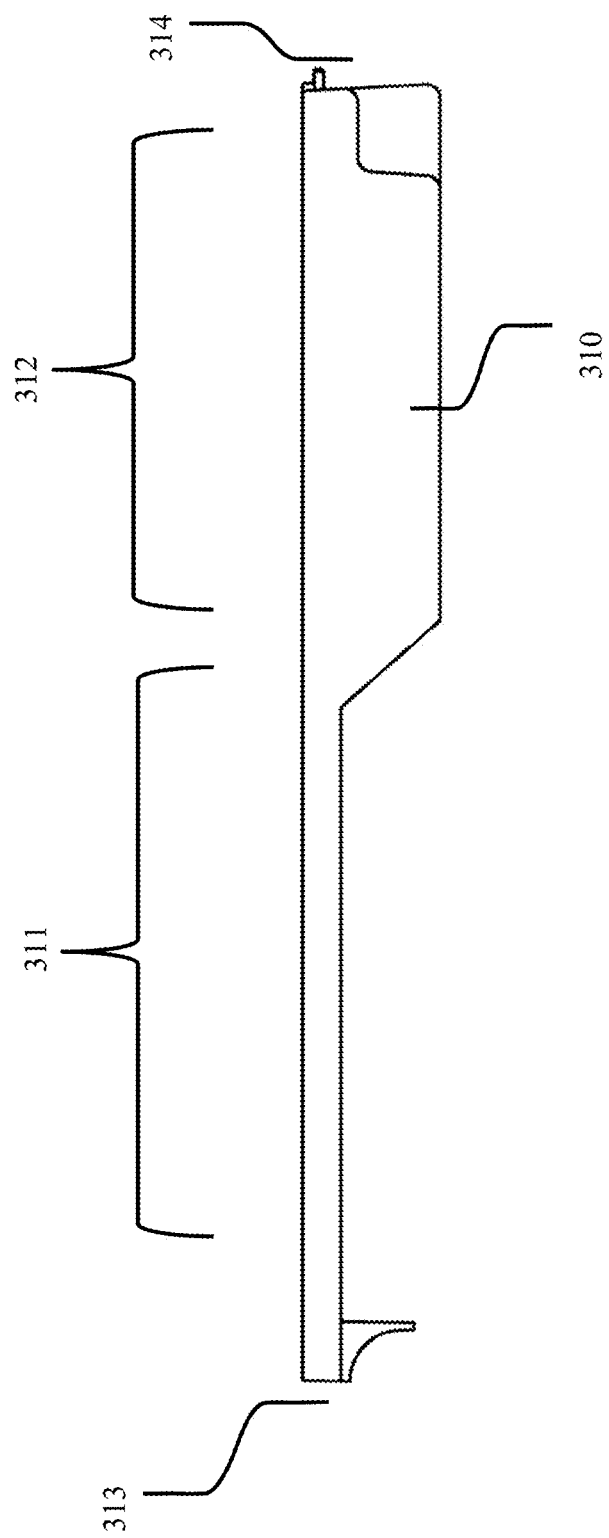
FIG. 6 shows a right side view illustration of an exemplary baffle, per an embodiment herein.

As shown per FIGS. 3 and 6, the baffle 310 may comprise a first portion 311 and a second portion 312. A delineating plane between the first portion 311 and the second portion 312 may be coincident to: a contact point between the baffle 310 and the I/O device; a downstream contact point between the baffle 310 and the upstream electrical device 320; or a downstream contact point between the baffle 310 and the downstream electrical device 330. The first portion 311 may be upstream of the second portion 312. In some embodiments, a ratio of a volume the first portion 311 and a volume the second portion 312 of about 1:10 to about 10:1.

The first portion 311 may comprise a fluid inlet 313. At least a part of the fluid inlet 313 may be upstream of at least a portion of the upstream electrical device 320. The fluid inlet 313 may receive ambient air, cooled air, or both. The fluid inlet 313 may be configured to attach to a duct to receive the ambient air, the cooled air, or both. At least a part of the fluid inlet 313 may contact or reside above a portion of the upstream electrical device 320. The fluid inlet 313 may comprise a filter to capture a particulate. The fluid inlet 313 may contact a portion of the base of the I/O device 350. The fluid inlet 313 may removably or permanently couple to a portion of the base of the I/O device 350. The fluid inlet 313 may form an air-tight seal against at least a portion of the base of the I/O device 350. The fluid inlet 313 may contact a portion of the downstream electrical device 330. The fluid inlet 313 may removably or permanently couple to the downstream electrical device 330. The fluid inlet 313 may form an air-tight seal against at least a portion of the downstream electrical device 330. The fluid inlet 313 may contact a portion of the upstream electrical device 320. The fluid inlet 313 may removably or permanently couple to the upstream electrical device 320. The fluid inlet 313 may form an air-tight, or substantially air-tight, seal against at least a portion of the upstream electrical device 320.

The second portion 312 may comprise a fluid outlet 314. The fluid outlet 314 may direct the fluid 301 towards the exhaust 340 of the I/O device 350. The fluid outlet 314 may contact a portion of the exhaust of the I/O device 350. The fluid outlet 314 may removably or permanently couple to a portion of the exhaust 340 of the I/O device 350. The fluid outlet 314 may form an air-tight seal against at least a portion of the exhaust 340 of the I/O device 350. The fluid outlet 314 may contact a portion of the base of the I/O device 350. The fluid outlet 314 may removably or permanently couple to a portion of the base of the I/O device 350. The fluid outlet 314 may form an air-tight seal against at least a portion of the base of the I/O device 350. The fluid outlet 314 may contact a portion of the downstream electrical device 330. The fluid outlet 314 may removably or permanently couple to the downstream electrical device 330. The fluid outlet 314 may form an air-tight seal against at least a portion of the downstream electrical device 330. The fluid outlet 314 may contact a portion of the upstream electrical device 320. The fluid outlet 314 may removably or permanently couple to the upstream electrical device 320. The fluid outlet 314 may form an air-tight seal against at least a portion of the upstream electrical device 320.

At least a portion of the fluid outlet 314 may surround at least a portion of the downstream electrical device 330, a heatsink of the downstream electrical device 330, or both. In some embodiments, the first portion 311 is offset from the second portion 312 in one or more directions.

In some embodiments, a ratio between an area of the fluid inlet 313 and an area of the fluid outlet 314 is about 1:10 to about 10:1. The area of the fluid inlet 313 may be measured as a normal area of the fluid inlet 313, a curved area of the fluid inlet 313, or a total surface area of the fluid inlet 313. The area of the fluid outlet 314 may be measured as a normal area of the fluid outlet 314, a curved area of the fluid outlet 314, or a total surface area of the fluid outlet 314.

The inner height of the fluid inlet 313 may be greater than an inner height of the fluid outlet 314. The inner height of the fluid inlet 313 may be less than an inner height of the fluid outlet 314. In some embodiments, a ratio between the inner height of the fluid inlet 313 and the inner height of the fluid outlet 314 is about 1:10 to about 10:1. The inner height of the fluid inlet 313 may be measured as a mean inner height, a maximum inner height, or a median inner height of the fluid inlet 313. The inner height of the fluid outlet 314 may be measured as a mean inner height, a maximum inner height, or a median inner height of the fluid outlet 314. The height of at least one of fluid inlet 313 and the fluid outlet 314 may be measured as a normal height. At least one of the height of the fluid inlet 313, the height of the fluid outlet 314, the volume the first portion 311, and the volume the second portion 312 may be size for a specific upstream electrical device 320 or downstream electrical device 330.

Figure 4:
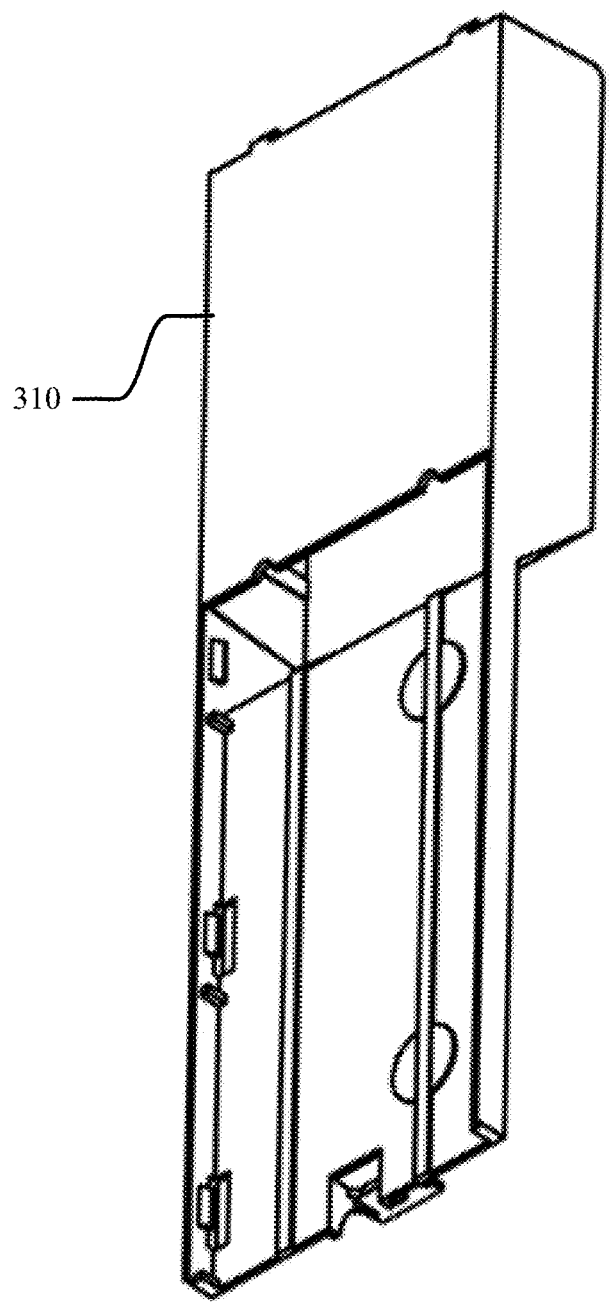
FIG. 4 shows a top front right perspective view illustration of an exemplary baffle, per an embodiment herein.
Figure 5:
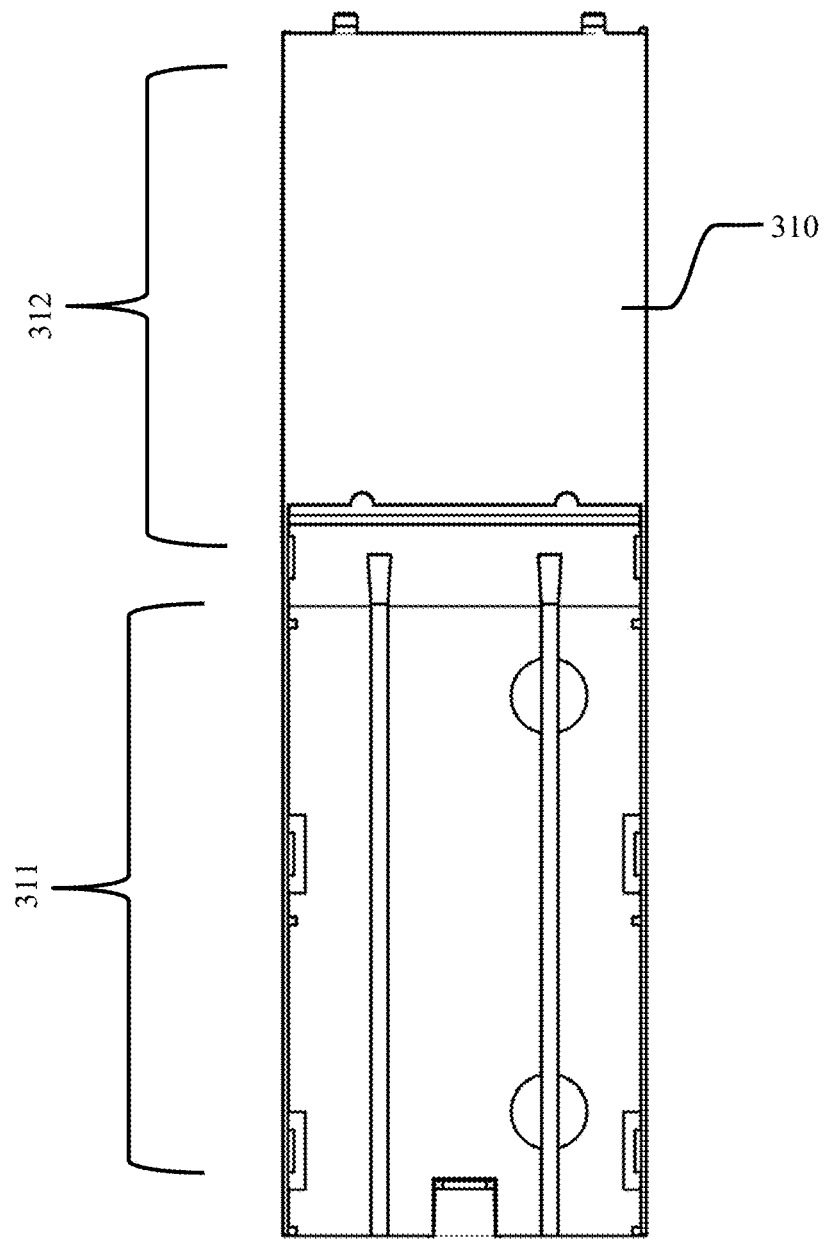
FIG. 5 shows a top plan view illustration of an exemplary baffle, per an embodiment herein.
Figure 7:
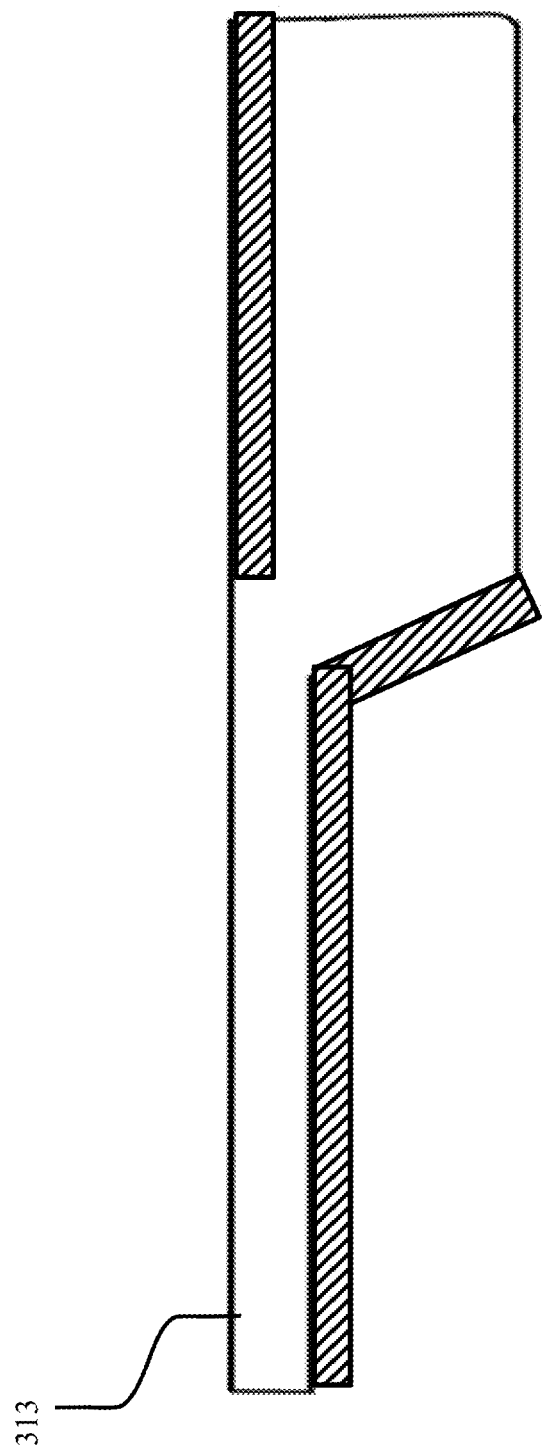
FIG. 7 shows a cross-sectional right side view illustration of a first exemplary baffle, per an embodiment herein.
Figure 8:
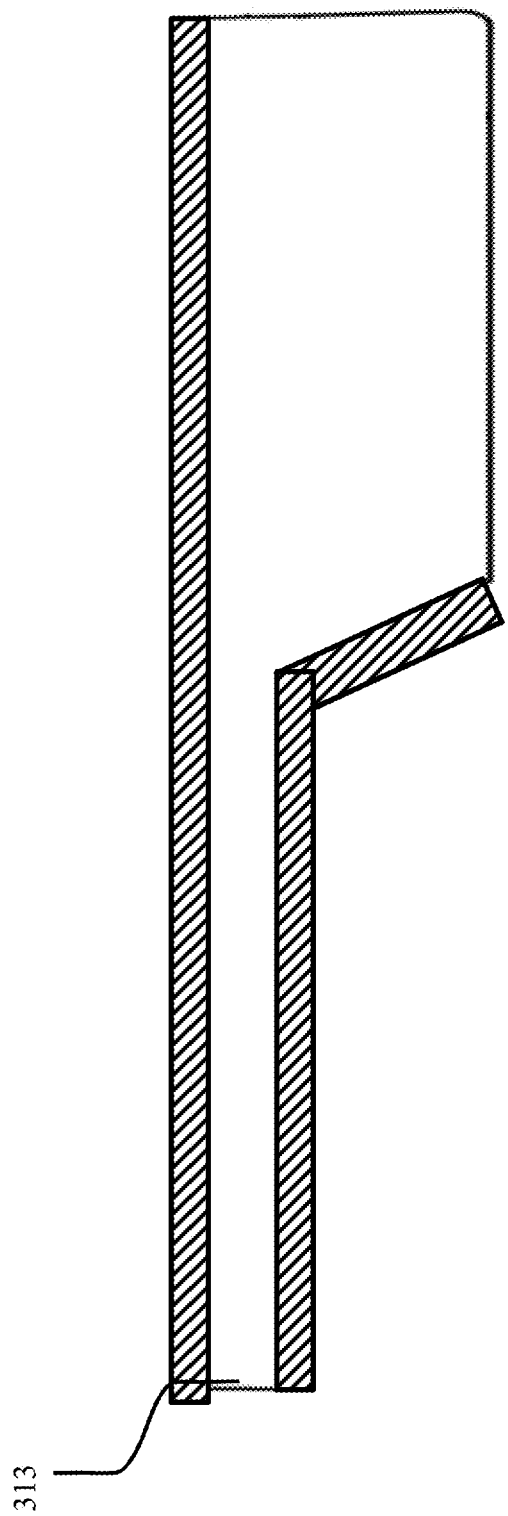
FIG. 8 shows a cross-sectional right side view illustration of a second exemplary baffle, per an embodiment herein.

Per FIGS. 4, 5, and 7, at least a part of a top side of the first portion 311 is open or uncovered. Further, per FIGS. 7-13, at least a part of a bottom side of the second portion 312 may open or uncovered. Alternatively, the entire bottom side of the second portion 312 may be open or uncovered. In such embodiments, the fluid inlet 313 may extend from a distal point of the first portion 311 to the intersection of the first portion 311 and the second portion 312. Alternatively, the part of a top side of the first portion 311 may comprise a perforation configured to allow airflow through the top side of the first portion 311. Alternatively, per FIGS. 8 and 9, the entirety of top side of the first portion 311 is closed or covered. In such embodiments, the fluid inlet 313 does extend from a distal point of the first portion 311. Further, the top side of the first portion 311 may not comprise a perforation. At least about 10%, 20%, 30%, 40%, 50%, 60%, 70%, 80%, or 90%, including increments therein, of the top side of the baffle 301 may be open. At least about 10%, 20%, 30%, 40%, 50%, 60%, 70%, 80%, or 90%, including increments therein, of the bottom side of the baffle 301 may be open. At least about 10%, 20%, 30%, 40%, 50%, 60%, 70%, 80%, or 90%, including increments therein, of the top side of the top side, the bottom side, or both of the first portion 311 of the baffle 301 may be open. At least about 10%, 20%, 30%, 40%, 50%, 60%, 70%, 80%, or 90%, including increments therein, of the top side of the top side, the bottom side, or both of the second portion 312 of the baffle 301 may be open.

Figure 9:
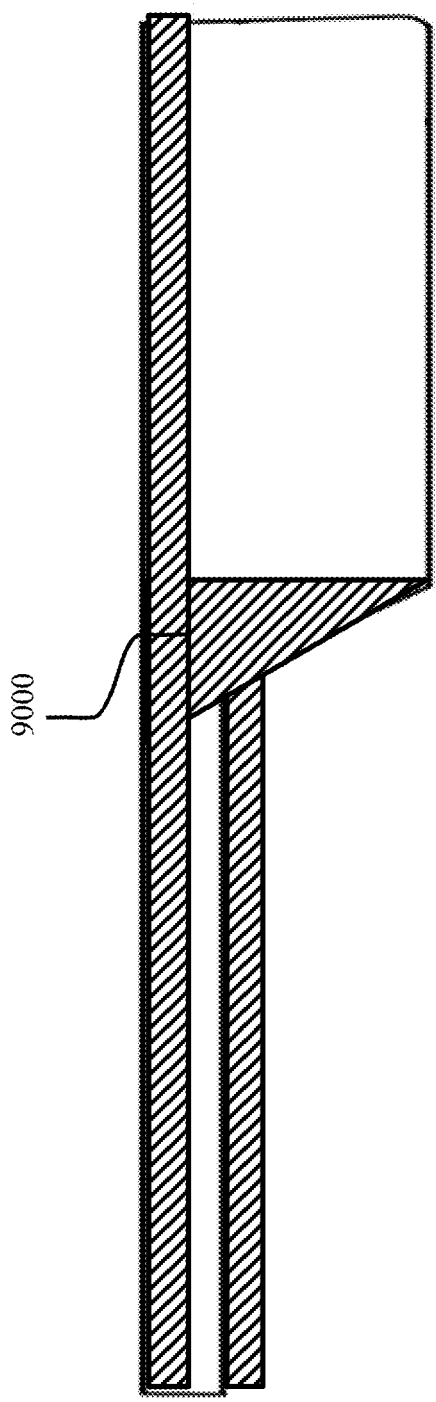
FIG. 9 shows a cross-sectional right side view illustration of a third exemplary baffle, per an embodiment herein.
Figure 10:
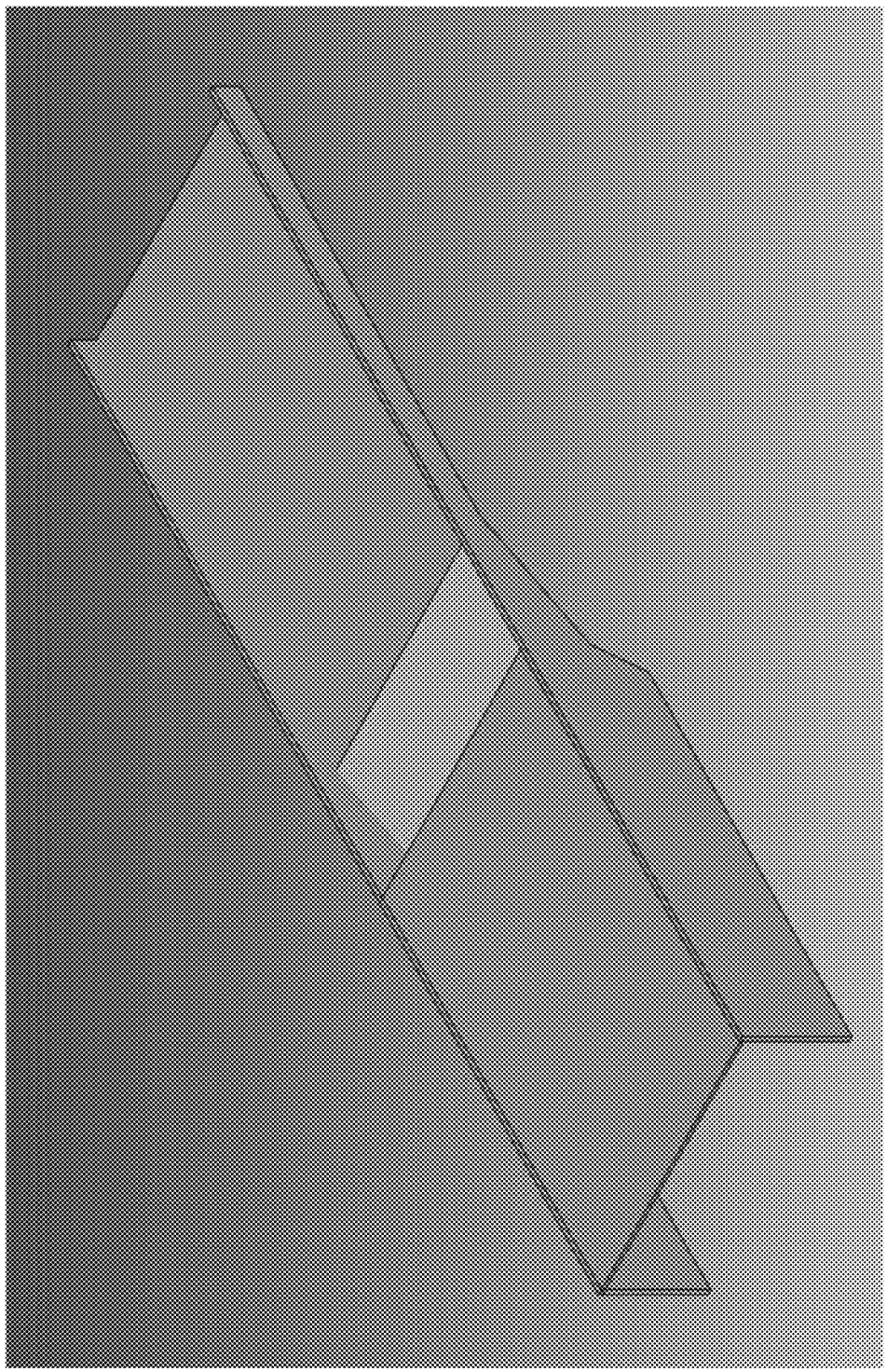
FIG. 10 shows a top front right perspective view illustration of an exemplary first baffle, per an embodiment herein.
Figure 11:
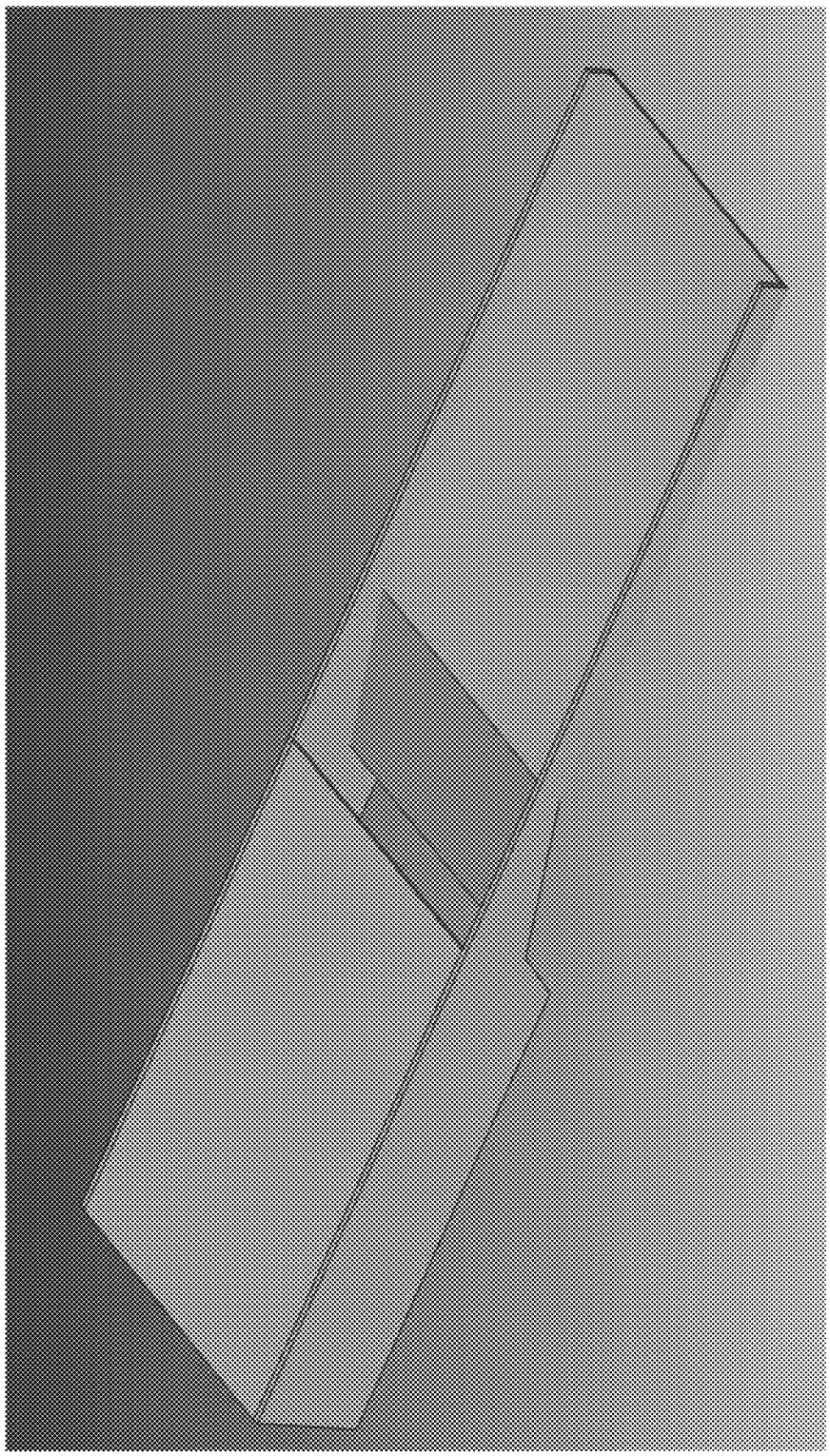
FIG. 11 shows another top front right perspective view illustration of the exemplary first baffle, per an embodiment herein.

In some embodiments, per FIG. 9, an interior of at least one of the first portion 311 and the second portion 312 comprises a fluid redirection fin 9000. The baffle 310 may comprise the fluid redirection fin 9000 if the top side of the first portion 311 is covered or uncovered.

Figure 12:
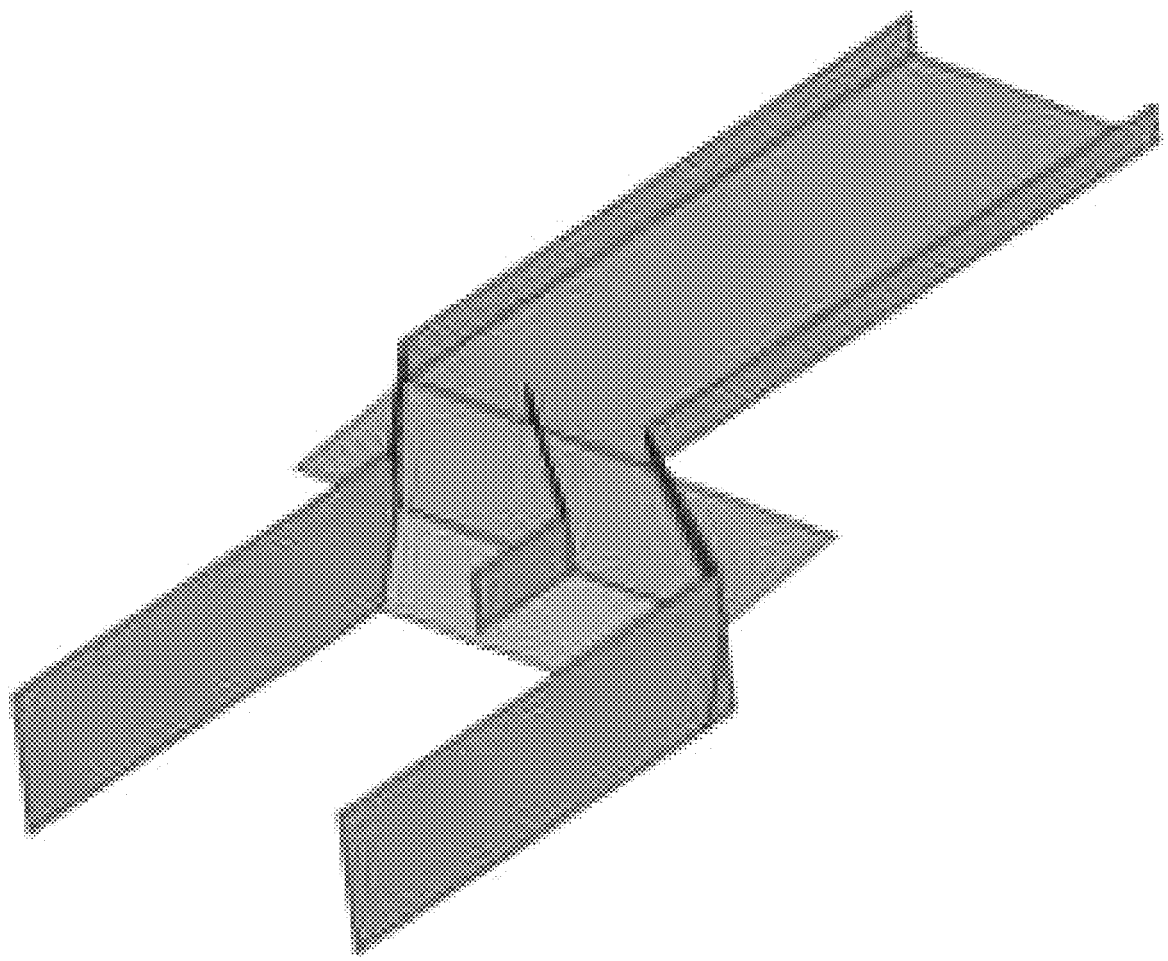
FIG. 12 shows a top front right perspective view illustration of an exemplary second baffle, per an embodiment herein.
Figure 13:
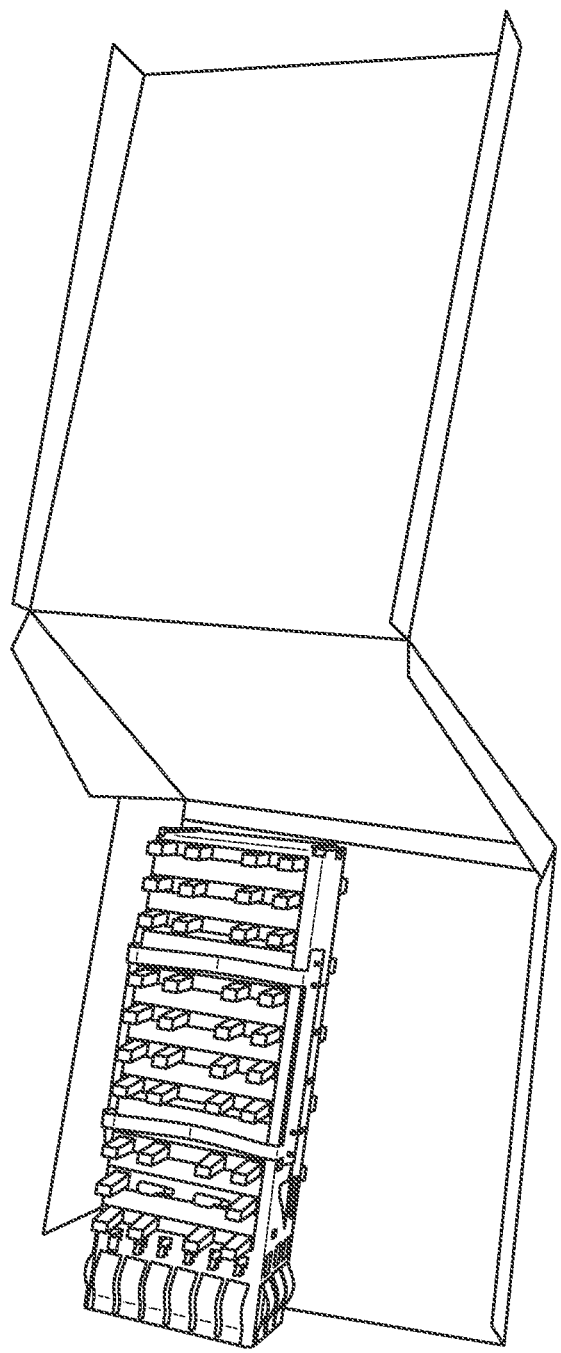
FIG. 13 shows a top right perspective view image of a mockup of an exemplary baffle, per an embodiment herein.
Figure 14:
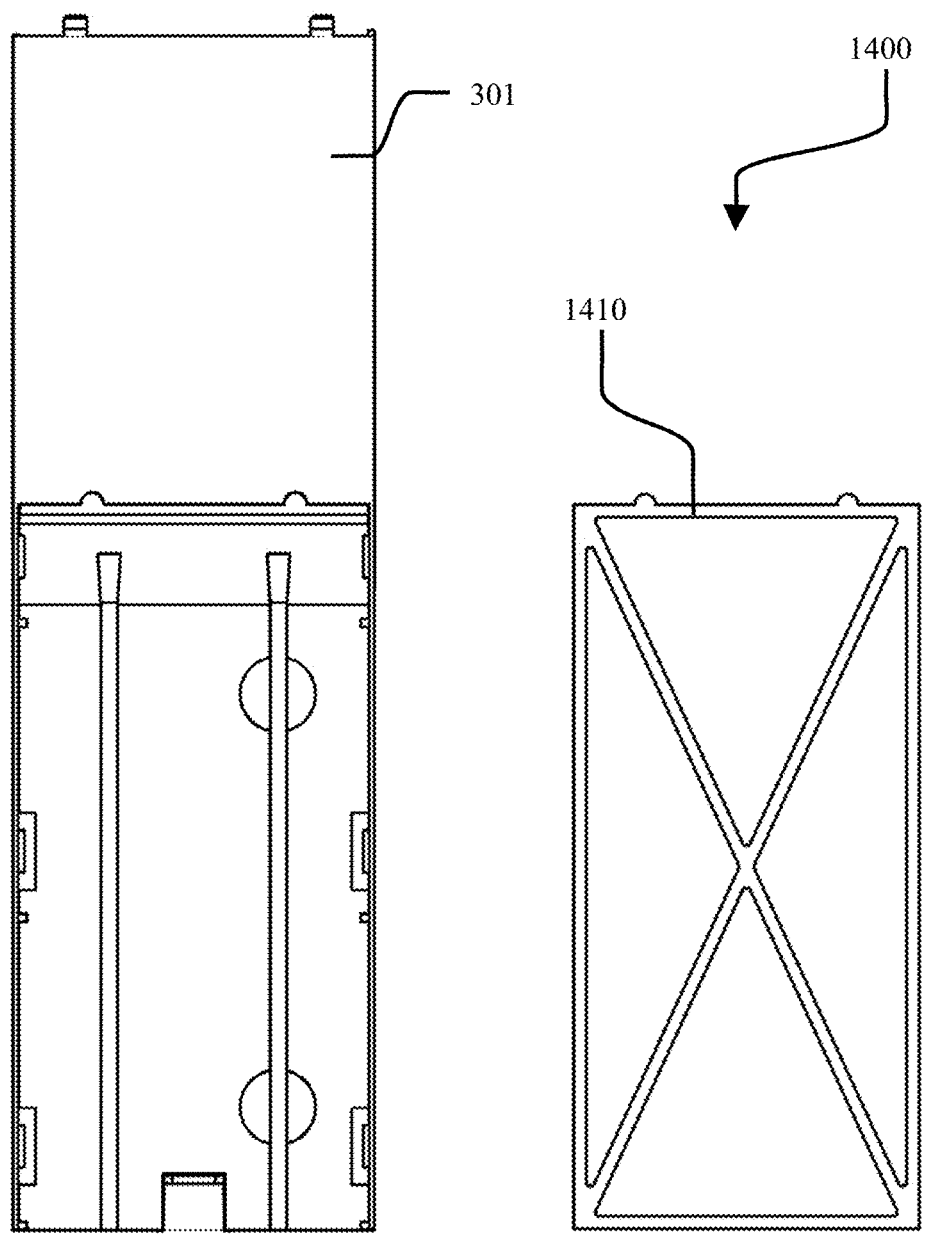
FIG. 14 shows a top plan view illustration of an exemplary baffle assembly comprising an exemplary baffle and an exemplary cover, per an embodiment herein.
Figure 15:
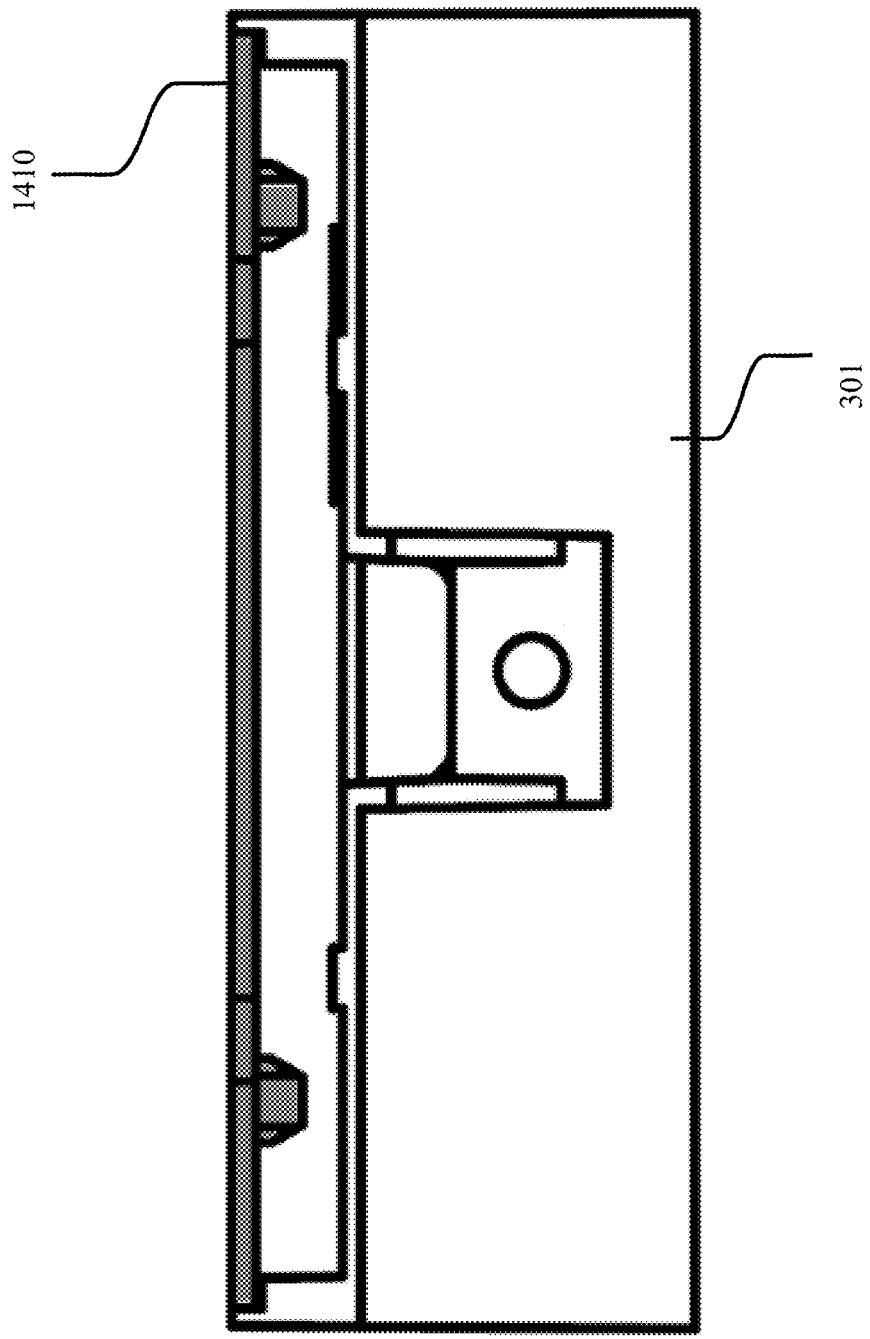
FIG. 15 shows a back view illustration of the exemplary baffle assembly, per an embodiment herein.
Figure 16:
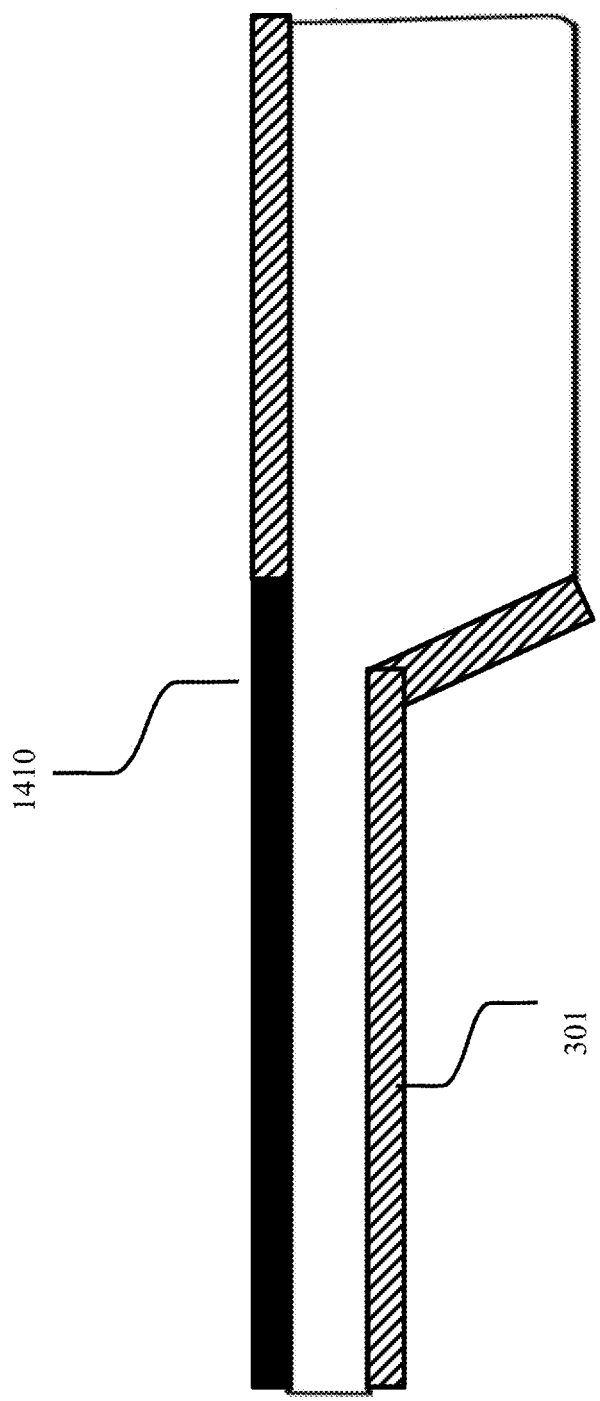
FIG. 16 shows a cross-sectional right side illustration of the exemplary baffle assembly, per an embodiment herein.

Per FIGS. 12 and 13, at least one of the first portion 311 and the second portion 312 of the baffle 310 may comprise a jog, an inflection point, or both.

In some embodiments, the fluid comprises air, a gas, water, or a liquid. In some embodiments, a pressure of the fluid at the fluid inlet is greater than the pressure of the fluid at the fluid outlet. In some embodiments, a pressure of the fluid at the fluid inlet is greater than the pressure of the fluid at the fluid outlet by about 0.75 inches of water gauge (iwg) to about 3 iwg.

In some embodiments, a temperature of the fluid at the fluid inlet is about 25° C. to about 75° C. In some embodiments, a temperature of the fluid at the fluid inlet is at least about 25° C., 30° C., 35° C., 40° C., 45° C., 50° C., 55° C., 60° C., or 65° C., including increments therein. In some embodiments, a temperature of the fluid at the fluid inlet is about 25° C., 30° C., 35° C., 40° C., 45° C., 50° C., 55° C., 60° C., 65° C., or 70° C., including increments therein. In some embodiments, a temperature of the fluid at the fluid outlet is about 45° C. to about 100° C. In some embodiments, a temperature of the fluid at the fluid outlet is at least about 45° C., 50° C., 55° C., 60° C., 65° C., 70° C., 75° C., 80° C., 85° C., 90° C., or 95° C., including increments therein. In some embodiments, a temperature of the fluid at the fluid outlet is about 45° C., 50° C., 55° C., 60° C., 65° C., 70° C., 75° C., 80° C., 85° C., 90° C., 95° C., or 100° C., including increments therein.

The baffle may decrease a temperature of the upstream electrical device by at least about 2.5%, 5%, 10%, 15%, or 20% including increments therein. The baffle may decrease a temperature of the upstream electrical device by about 2.5% to about 25%. The baffle may decrease a temperature of the upstream electrical device by at least about 3° C., 4° C., 5° C., 6° C., 7° C., 8° C., 10° C., 12° C., 14° C., 16° C., 18° C., or 20° C., including increments therein. The baffle may decrease a temperature of the upstream electrical device by about 3° C. to about 22° C. The fluid may flow through the baffle at a rate of at least about 250 liquid flow meters (LFM), 300 LFM, 350 LFM, 400 LFM, 450 LFM, 500 LFM, 600 LFM, 700 LFM, 800 LFM, 900 LFM, or 1000 LFM, including increments therein. The fluid may flow through the baffle at a rate of about 250 liquid flow meters (LFM), 300 LFM, 350 LFM, 400 LFM, 450 LFM, 500 LFM, 600 LFM, 700 LFM, 800 LFM, 900 LFM, or 1000 LFM, including increments therein. The baffle may redirect about 1%, 2%, 3%, 4%, 5%, 6%, 8%, 10%, 15%, 20%, 25%, 30%, 35%, 40%, 45%, 50%, 60%, 70%, 80%, or 90%, including increments therein, of the fluid entering the I/O device around the upstream electrical device to the downstream electrical device. The baffle may redirect at least about 1%, 2%, 3%, 4%, 5%, 6%, 8%, 10%, 15%, 20%, 25%, 30%, 35%, 40%, 45%, 50%, 60%, 70%, 80%, or 90%, including increments therein, of the fluid entering the I/O device around the upstream electrical device to the downstream electrical device.

Baffle Assemblies

Also provided herein, per FIGS. 14-20 is a baffle assembly 1400 comprising the baffle 301 and a baffle cover 1410. As seen, the top side of the first portion may comprise an opening, wherein the baffle cover 1410 couples to and encloses the opening. The baffle cover 1410 may provide an air-tight seal against the baffle 301. The baffle cover 1410 may comprise an opening, a perforation, or both.

Figure 17:
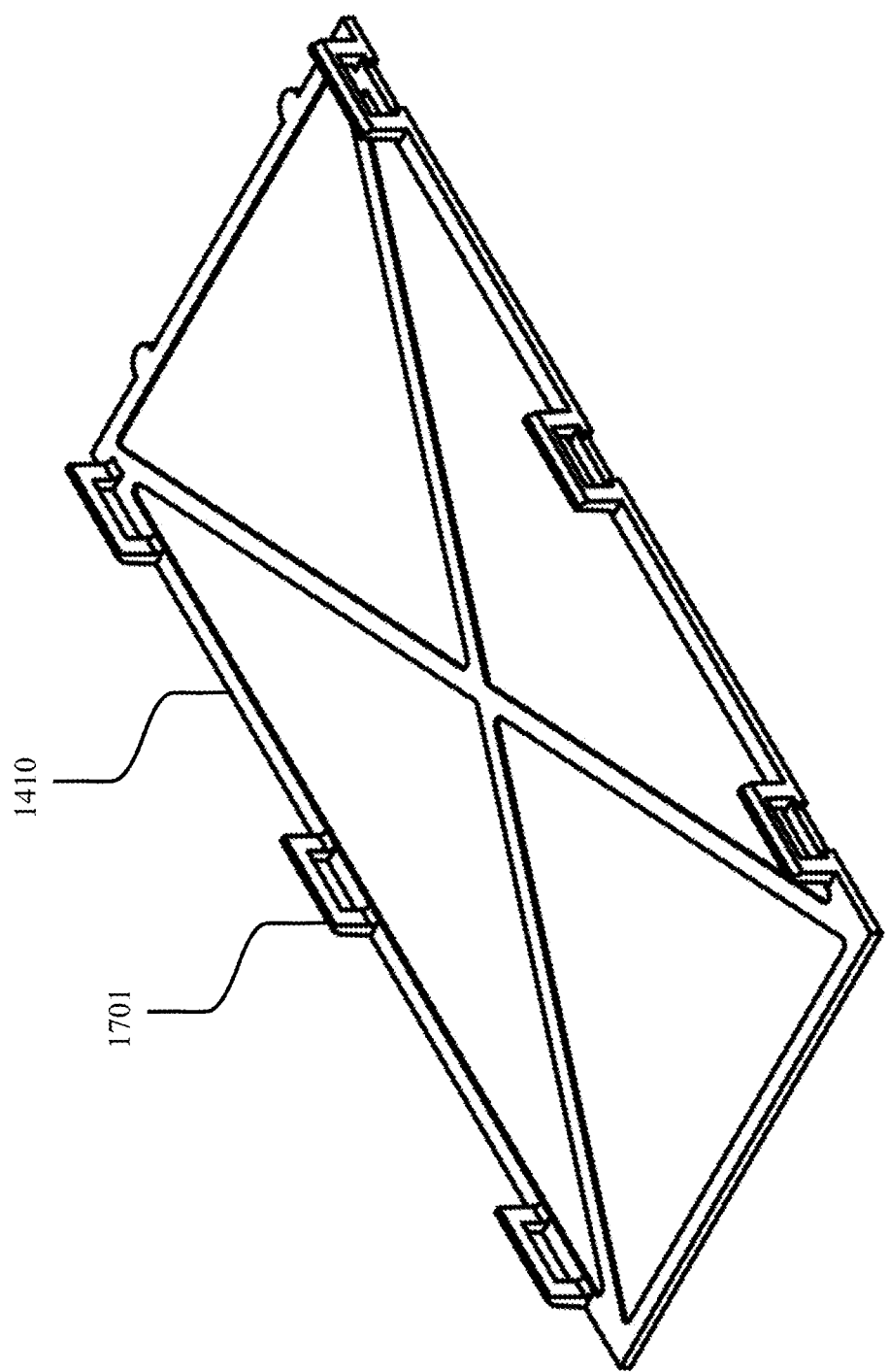
FIG. 17 shows a bottom front left perspective view illustration of the exemplary cover, per an embodiment herein.
Figure 18:
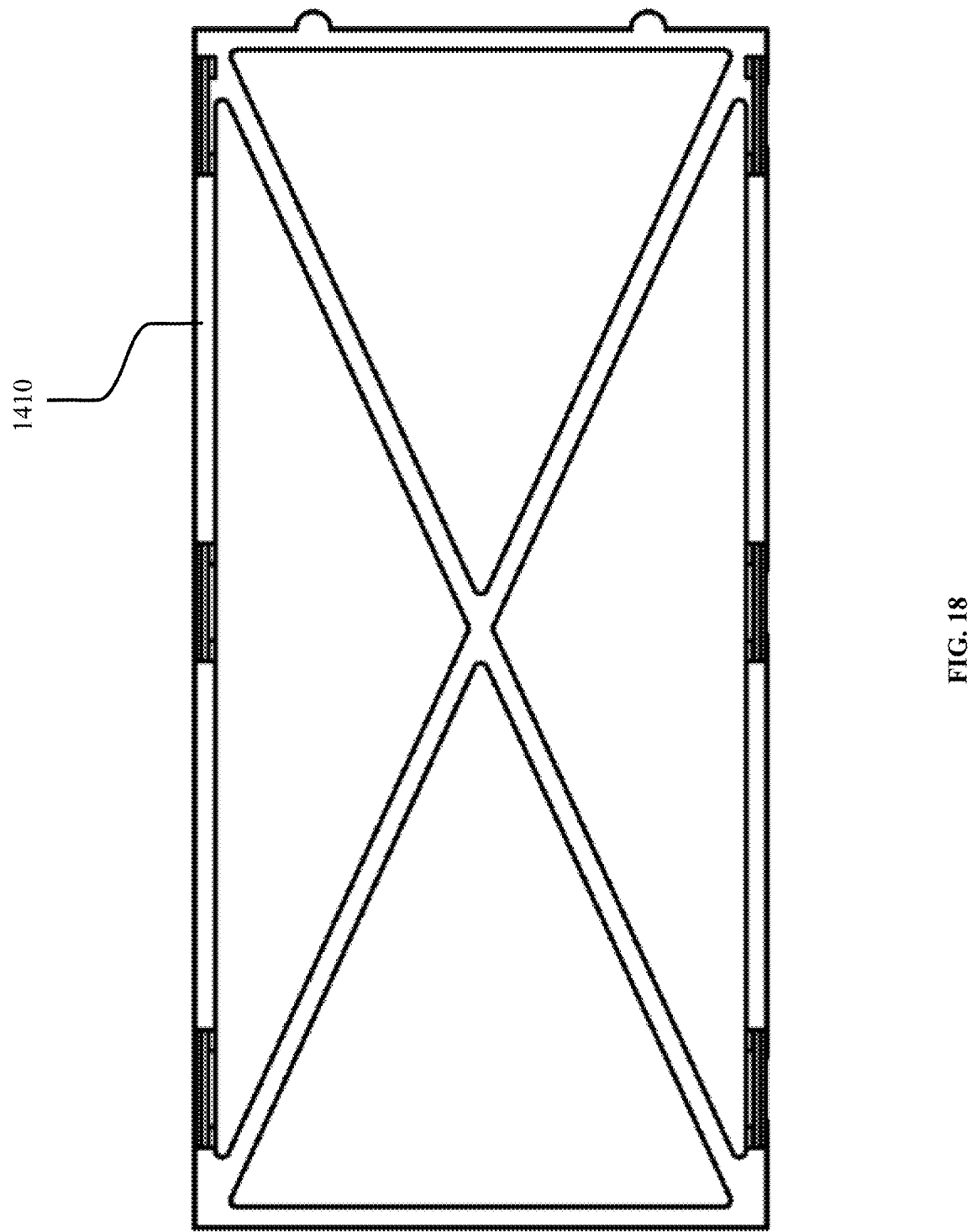
FIG. 18 shows a bottom plan view illustration of the exemplary cover, per an embodiment herein.
Figure 19:
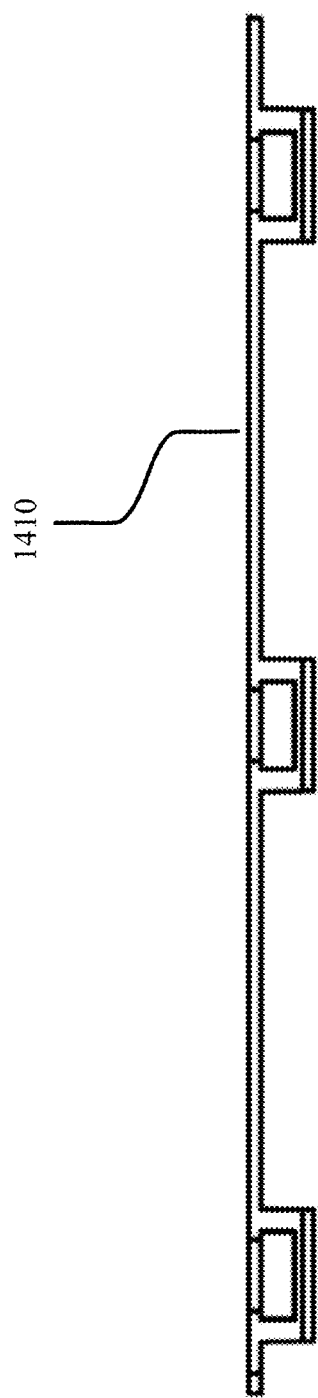
FIG. 19 shows a right side view illustration of the exemplary cover, per an embodiment herein.
Figure 20:
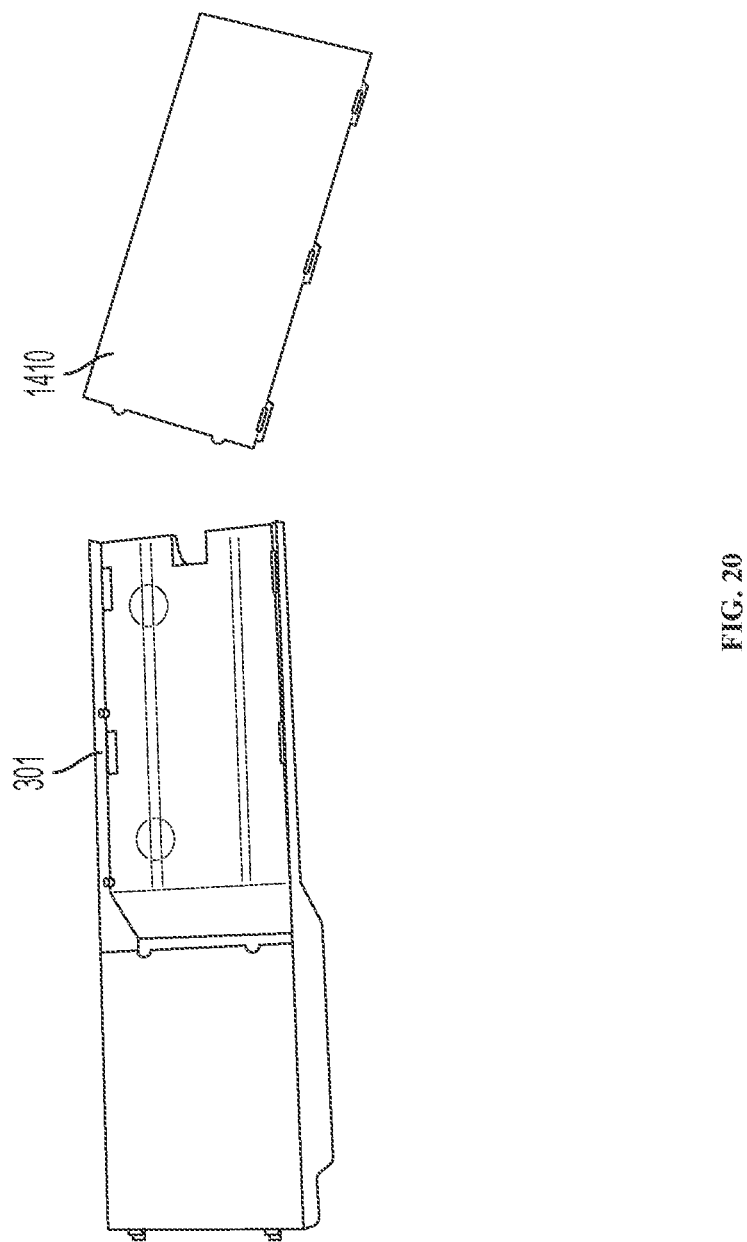
FIG. 20 shows a top right perspective view image of an exemplary disassembled baffle assembly, per an embodiment herein.
Figure 21:
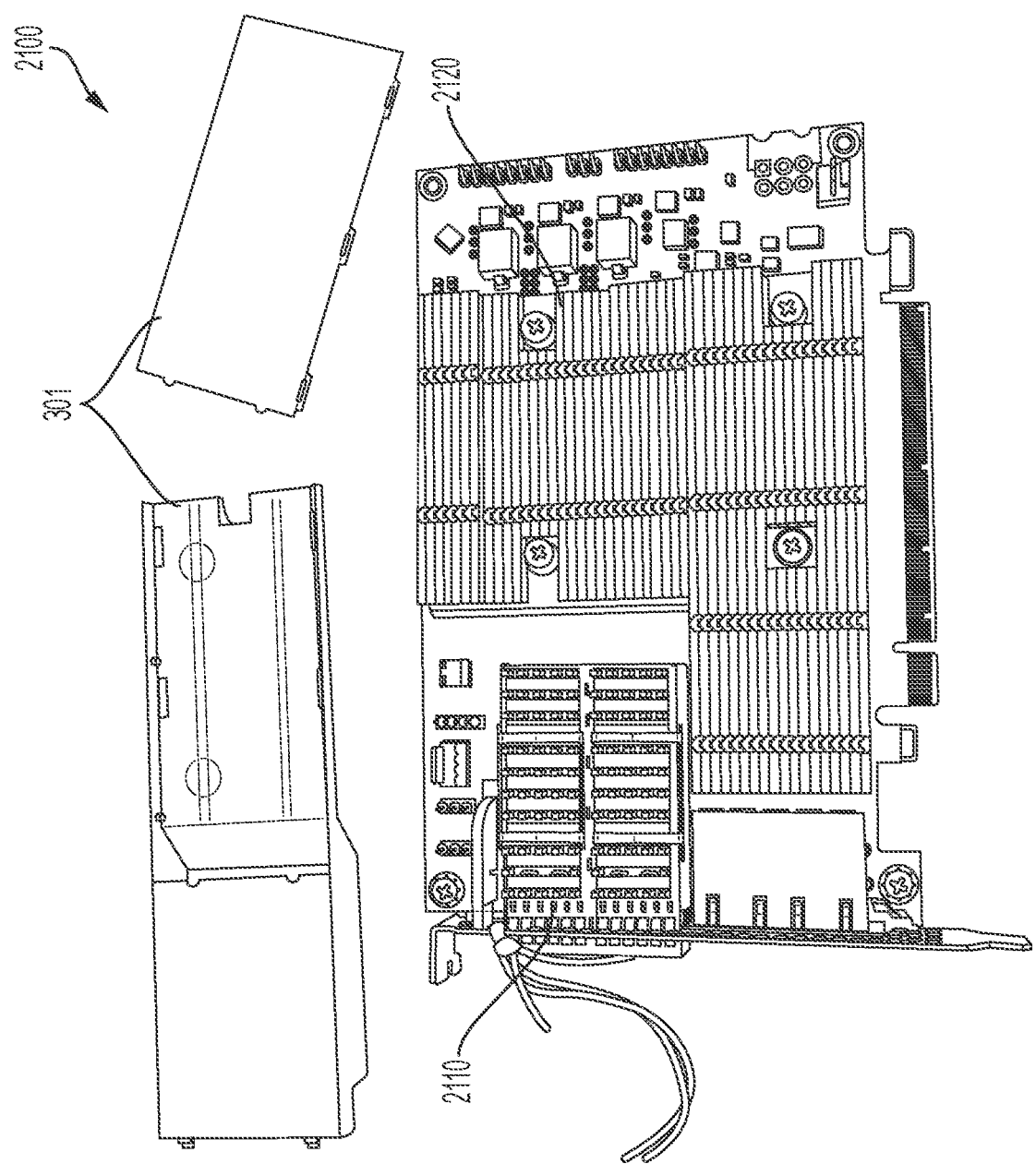
FIG. 21 shows a top right perspective view image of an exemplary disassembly I/O device with a baffle, per an embodiment herein.
Figure 22:
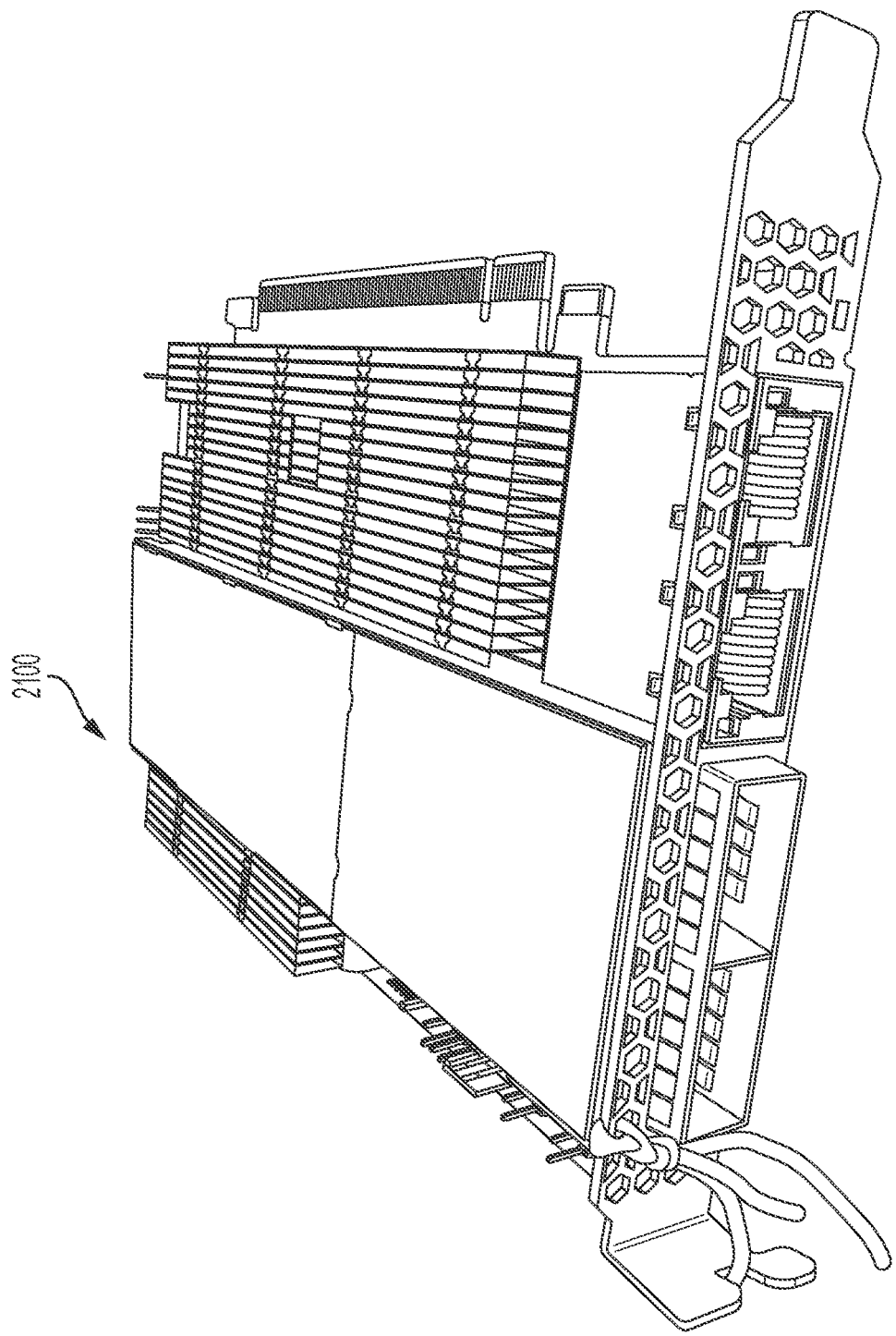
FIG. 22 shows a top front perspective view image of an exemplary I/O device with an exemplary baffle assembly, per an embodiment herein.
Figure 23:
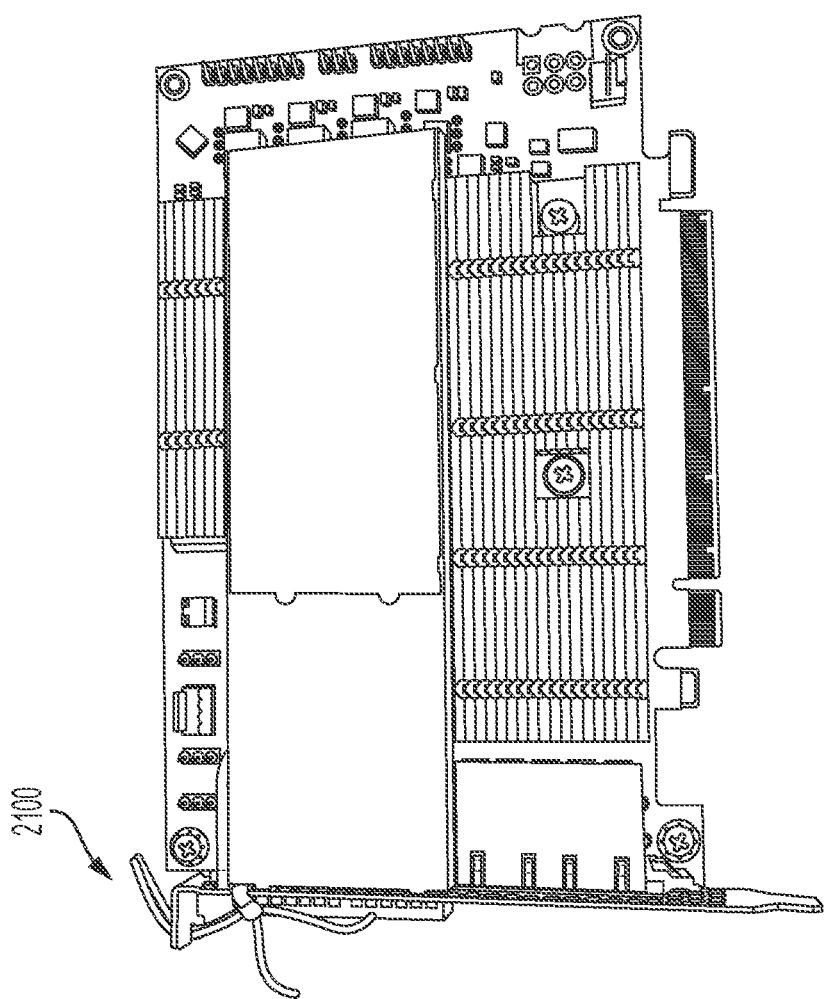
FIG. 23 shows a top view image of an exemplary I/O device with an exemplary baffle assembly, per an embodiment herein.
Figure 24:
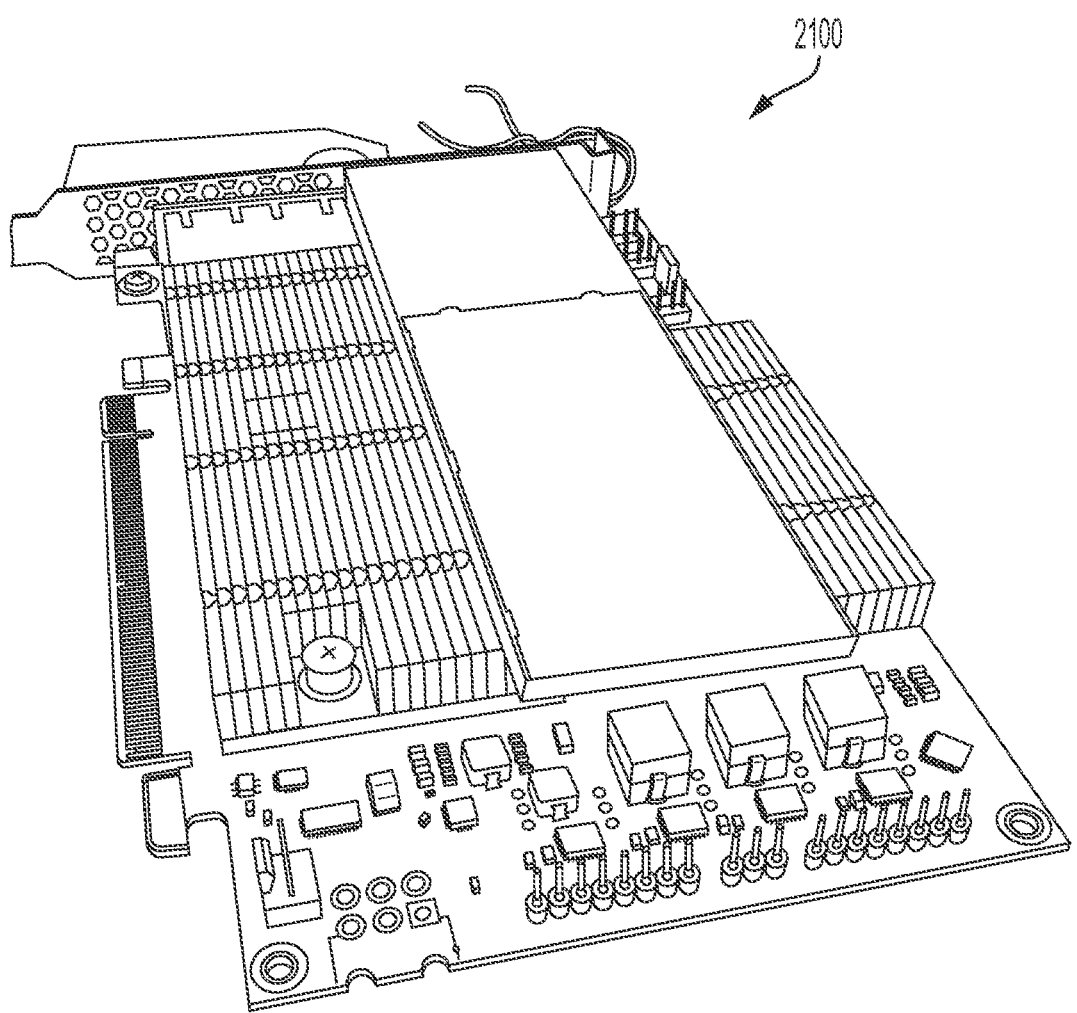
FIG. 24 shows a back top perspective view image of an exemplary I/O device with an exemplary baffle assembly, per an embodiment herein.
Figure 25:
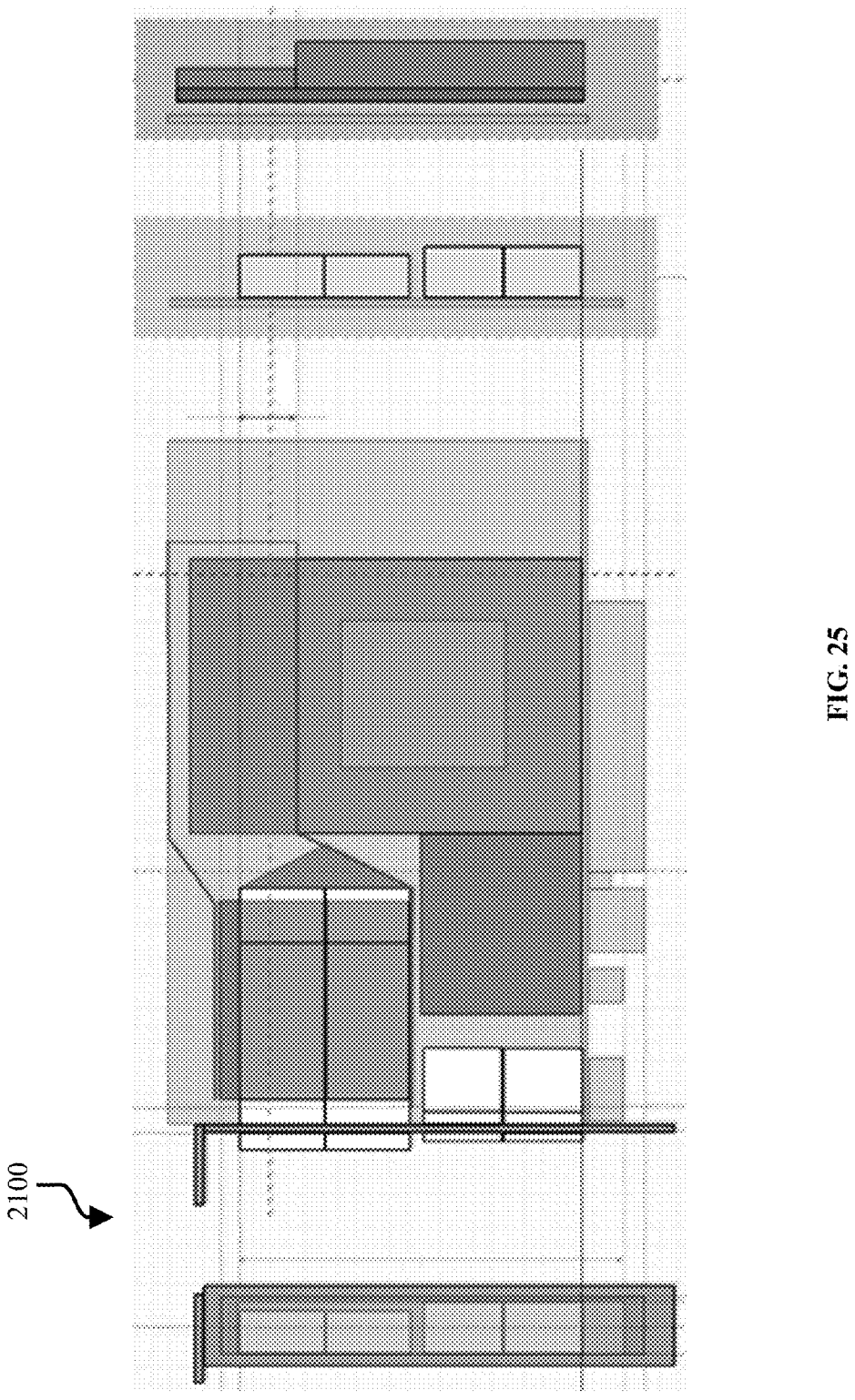
FIG. 25 shows top, front, back, and right plan view illustrations of an exemplary I/O device, per an embodiment herein.
Figure 26:
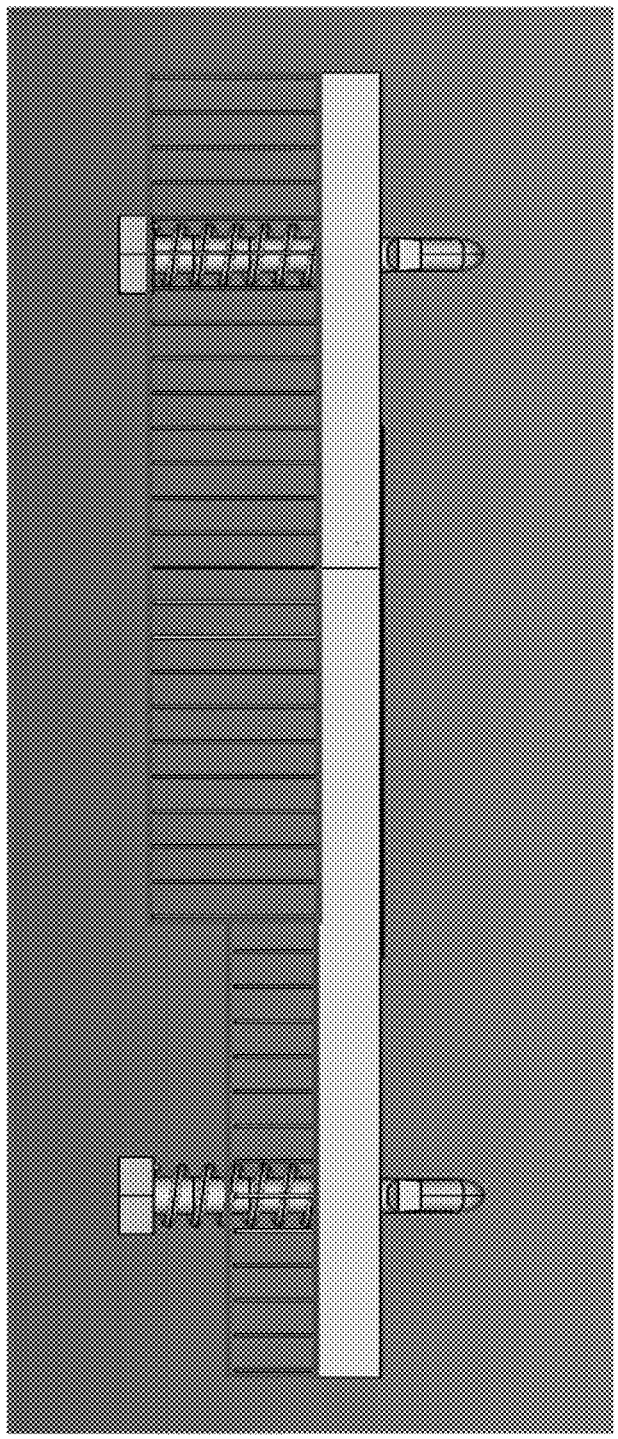
FIG. 26 shows a volumetric right side view illustration of an exemplary I/O device, per an embodiment herein.

Per FIG. 17, at least one of the baffle 301 and the baffle cover 1410 may comprise a fastener 1701 configured to permanently or removably adjoin the baffle 301 and the baffle cover 1410. The fastener 1701 may comprise a snap, a clasp, a zipper, an adhesive, a screw, a nut, a tab, a bolt, a magnet, or any combination thereof. At least one of the baffle 301 and the baffle cover 1410 may comprise 1, 2, 3, 4, 5, 6, 7, 8, 9, 10 or more fasteners 1701. At least one of the baffle 301 and the baffle cover 1410 may comprise a gasket configured to provide the air-tight, or substantially air-tight, seal.

The baffle 301 assembly 1400 may comprise 1, 2, 3, 4, 5, 6, 7, 8, 9, 10 or more baffle covers 1410. The baffle 301 and the baffle cover 1410 may be composed of the same material. The baffle 301 and the baffle cover 1410 may be composed of different materials. The baffle cover 1410 may be formed of plastic, wood, metal, ceramic, glass, fiberglass, carbon fiber, or any combination thereof. As shown, the baffle cover 1410 may comprise cross-bracing struts.

Input/Output (I/O) Devices Comprising a Baffle

Another aspect provided herein, per FIGS. 21-26 is an input/output (I/O) device 2100 comprising: an upstream electrical device 2210, a downstream electrical device 2110, and the baffles 301 presented herein. The I/O device 2100 may be housed within a computer and may additionally serve as an exhaust for air warmed by electrical devices and components within the computer. The I/O device 2100 may receive hot air warmed by electrical devices and components within the computer. The downstream electrical device 2110 may receive hot air warmed by electrical devices and components within the computer and by the upstream electrical device 2210. The computer may comprise one or more fans configured to propel hot air within the computer towards the I/O device 2100. The downstream electrical device 2110 may be the closest component of a computer to the exhaust of the computer.

The I/O device 2100 may comprise 1, 2, 3, 4, 5, 6, 7, 8, 9, 10 or more upstream electrical devices 2210. The I/O device 2100 may comprise 1, 2, 3, 4, 5, 6, 7, 8, 9, 10 or more downstream electrical devices 2220. The I/O device 2100 may comprise 1, 2, 3, 4, 5, 6, 7, 8, 9, 10 or more baffles 301. The upstream electrical device 2110 may emit heat. The baffle 301 may redirect a fluid around the upstream electrical device 2110 and to the downstream electrical device 2120. The baffle 301 may redirect a fluid around 1, 2, 3, 4, 5, 6, 7, 8, 9, 10, or more upstream electrical devices 2120 and to the downstream electrical device 2110. The baffle 301 may redirect a fluid around one upstream electrical device 2120 and to 1, 2, 3, 4, 5, 6, 7, 8, 9, 10, or more downstream electrical devices 2110. The baffle 301 may further redirect the fluid to an exhaust. The I/O device 2100 may comprise the exhaust. At least one of the upstream electrical device 2110 and the downstream electrical device 2120 may comprise a heatsink. At least one of the upstream electrical device 2110 and the downstream electrical device 2120 may comprise 1, 2, 3, 4, 5, 6, 7, 8, 9, 10, or more heatsinks. The baffle 301 may redirect about 1%, 2%, 3%, 4%, 5%, 6%, 8%, 10%, 15%, 20%, 25%, 30%, 35%, 40%, 45%, 50%, 60%, 70%, 80%, or 90%, including increments therein, of the fluid entering the I/O device 2100 around the upstream electrical device 2120 to the downstream electrical device 2110. The baffle 301 may redirect at least about 1%, 2%, 3%, 4%, 5%, 6%, 8%, 10%, 15%, 20%, 25%, 30%, 35%, 40%, 45%, 50%, 60%, 70%, 80%, or 90%, including increments therein, of the fluid entering the I/O device 2100 around the upstream electrical device 2120 to the downstream electrical device 2110.

At least one of the upstream electrical device 2110 and the downstream electrical device 2120 may comprise may comprise a digital processing device including one or more hardware central processing units (CPUs) or general purpose graphics processing units (GPGPUs) that carry out the device's functions. In still further embodiments, the digital processing device further comprises an operating system configured to perform executable instructions. In some embodiments, the digital processing device is optionally connected a computer network. In further embodiments, the digital processing device is optionally connected to the Internet such that it accesses the World Wide Web. In still further embodiments, the digital processing device is optionally connected to a cloud computing infrastructure. In other embodiments, the digital processing device is optionally connected to an intranet. In other embodiments, the digital processing device is optionally connected to a data storage device.

In some embodiments, the digital processing device includes an operating system configured to perform executable instructions. The operating system is, for example, software, including programs and data, which manages the device's hardware and provides services for execution of applications. Those of skill in the art will recognize that suitable server operating systems include, by way of non-limiting examples, FreeBSD, OpenBSD, NetBSD, Linux, Apple® Mac OS X Server®, Oracle® Solaris®, Windows Server®, and Novell® NetWare®. Those of skill in the art will recognize that suitable personal computer operating systems include, by way of non-limiting examples, Microsoft® Windows®, Apple® Mac OS X®, UNIX®, and UNIX-like operating systems such as GNU/Linux®. In some embodiments, the operating system is provided by cloud computing. Those of skill in the art will also recognize that suitable mobile smart phone operating systems include, by way of non-limiting examples, Nokia® Symbian® OS, Apple® iOS®, Research In Motion® BlackBerry OS®, Google® Android®, Microsoft® Windows Phone® OS, Microsoft® Windows Mobile® OS, Linux®, and Palm® WebOS®.

In some embodiments, the device includes a storage and/or memory device. The storage and/or memory device is one or more physical apparatuses used to store data or programs on a temporary or permanent basis. In some embodiments, the device is volatile memory and requires power to maintain stored information. In some embodiments, the device is non-volatile memory and retains stored information when the digital processing device is not powered. In further embodiments, the non-volatile memory comprises flash memory. In some embodiments, the non-volatile memory comprises dynamic random-access memory (DRAM). In some embodiments, the non-volatile memory comprises ferroelectric random access memory (FRAM). In some embodiments, the non-volatile memory comprises phase-change random access memory (PRAM). In other embodiments, the device is a storage device including, by way of non-limiting examples, CD-ROMs, DVDs, flash memory devices, magnetic disk drives, magnetic tapes drives, optical disk drives, and cloud computing based storage. In further embodiments, the storage and/or memory device is a combination of devices such as those disclosed herein.

Terms and Definitions

Unless otherwise defined, all technical terms used herein have the same meaning as commonly understood by one of ordinary skill in the art to which this disclosure belongs.

As used herein, the singular forms "a," "an," and "the" include plural references unless the context clearly dictates otherwise. Any reference to "or" herein is intended to encompass "and/or" unless otherwise stated.

As used herein, the term "about" refers to an amount that is near the stated amount by 10%, 5%, or 1%, including increments therein.

As used herein, the term "about" in reference to a percentage refers to an amount that is greater or less the stated percentage by 10%, 5%, or 1%, including increments therein.

As used herein, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" means A alone, B alone, C alone, A and B together, A and C together, B and C together, or A, B and C together.

As used herein, the term "heatsink" refers to a device for absorbing or shedding excessive or unwanted heat.

EXAMPLES

The following illustrative examples are representative of embodiments of the software applications, systems, and methods described herein and are not meant to be limiting in any way.

Exemplary I/O devices provided per FIGS. 27-33 comprise baffles specifically designed for different arrangements of upstream electrical devices 2703, a first downstream electrical device (DS1) 2701, and a second downstream electrical device (DS2) 2702.

Figure 27:
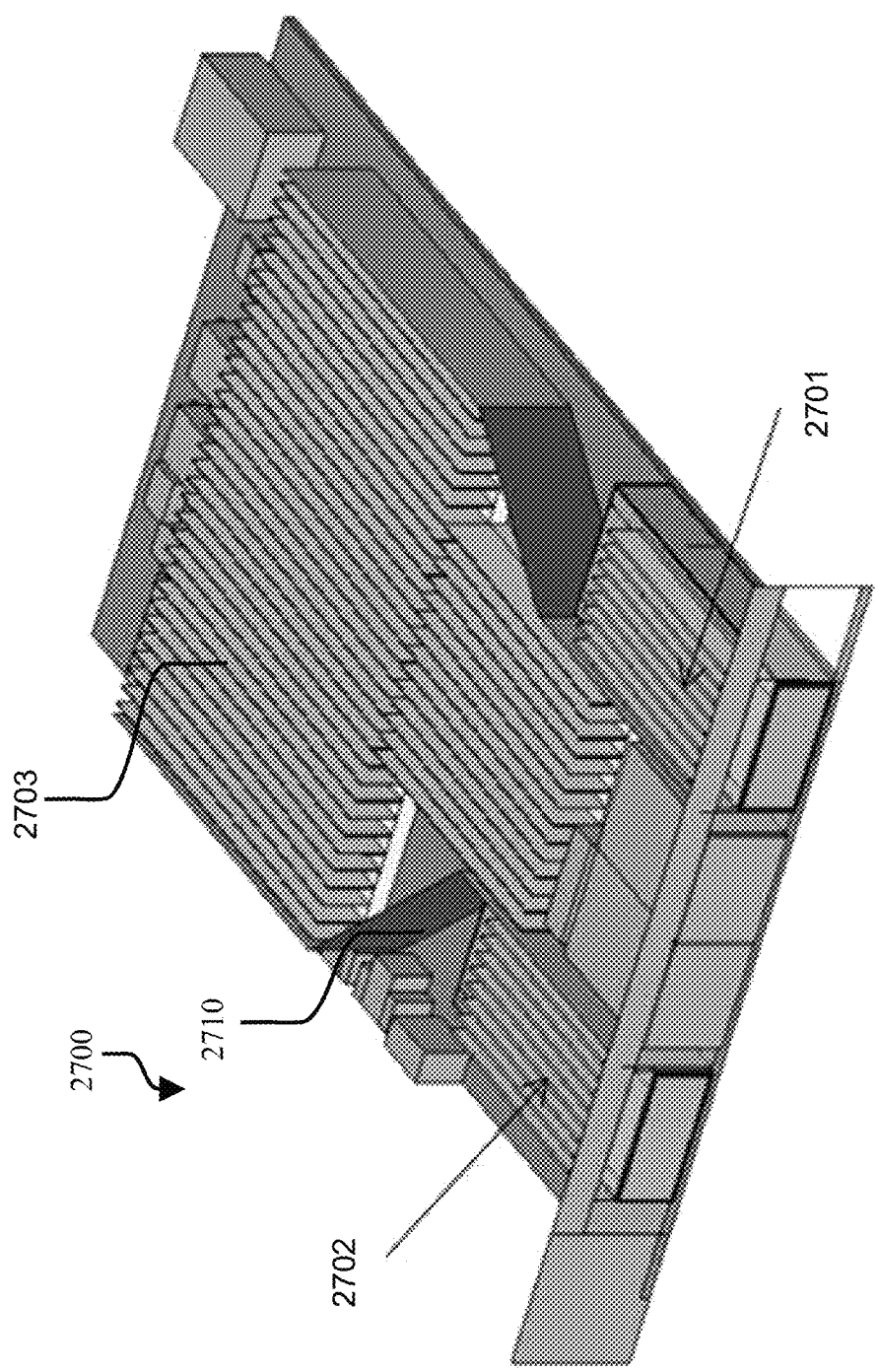
FIG. 27 shows a top front right perspective view illustration of an exemplary first I/O device comprising an exemplary baffle, per an embodiment herein.

FIG. 27 shows exemplary Device 1 2700 wherein the first downstream electrical device (DS1) 2701 and the second downstream electrical device (DS2) 2702 are separated, and wherein Baffle A 2710 channels the hot air from the upstream electrical device 2703 between the first downstream electrical device (DS1) 2701 and the second downstream electrical device (DS2) 2702, and to an exhaust.

Figure 28:
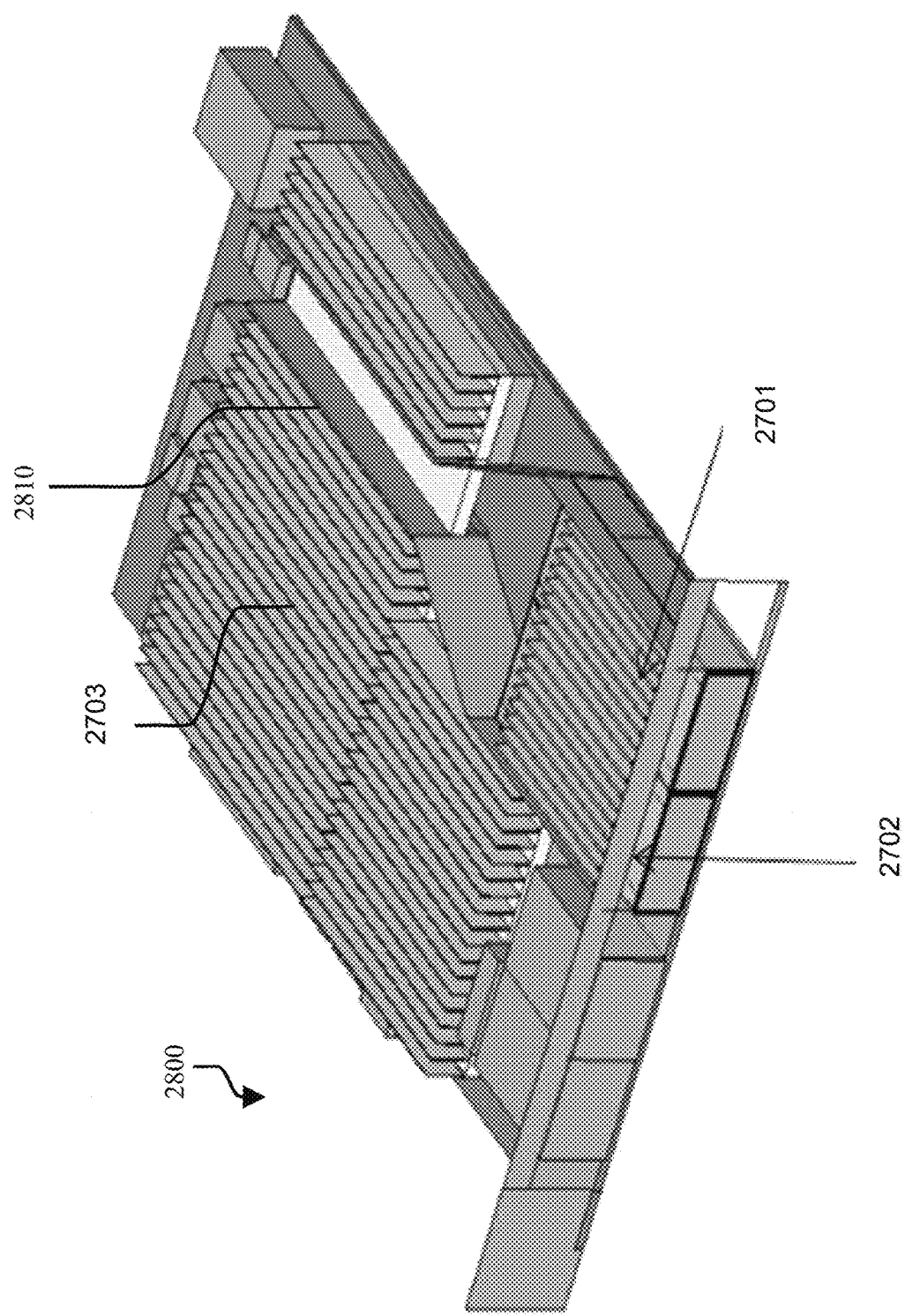
FIG. 28 shows a top front right perspective view illustration of an exemplary second I/O device comprising an exemplary baffle, per an embodiment herein.

FIG. 28 shows exemplary Device 2 2800 wherein the first downstream electrical device (DS1) 2701 and the second downstream electrical device (DS2) 2702 are adjoined, and wherein Baffle B 2910 channels the hot air from the upstream electrical device 2703 to the right of the first downstream electrical device (DS1) 2701 and the second downstream electrical device (DS2) 2702, and to an exhaust.

Figure 29:
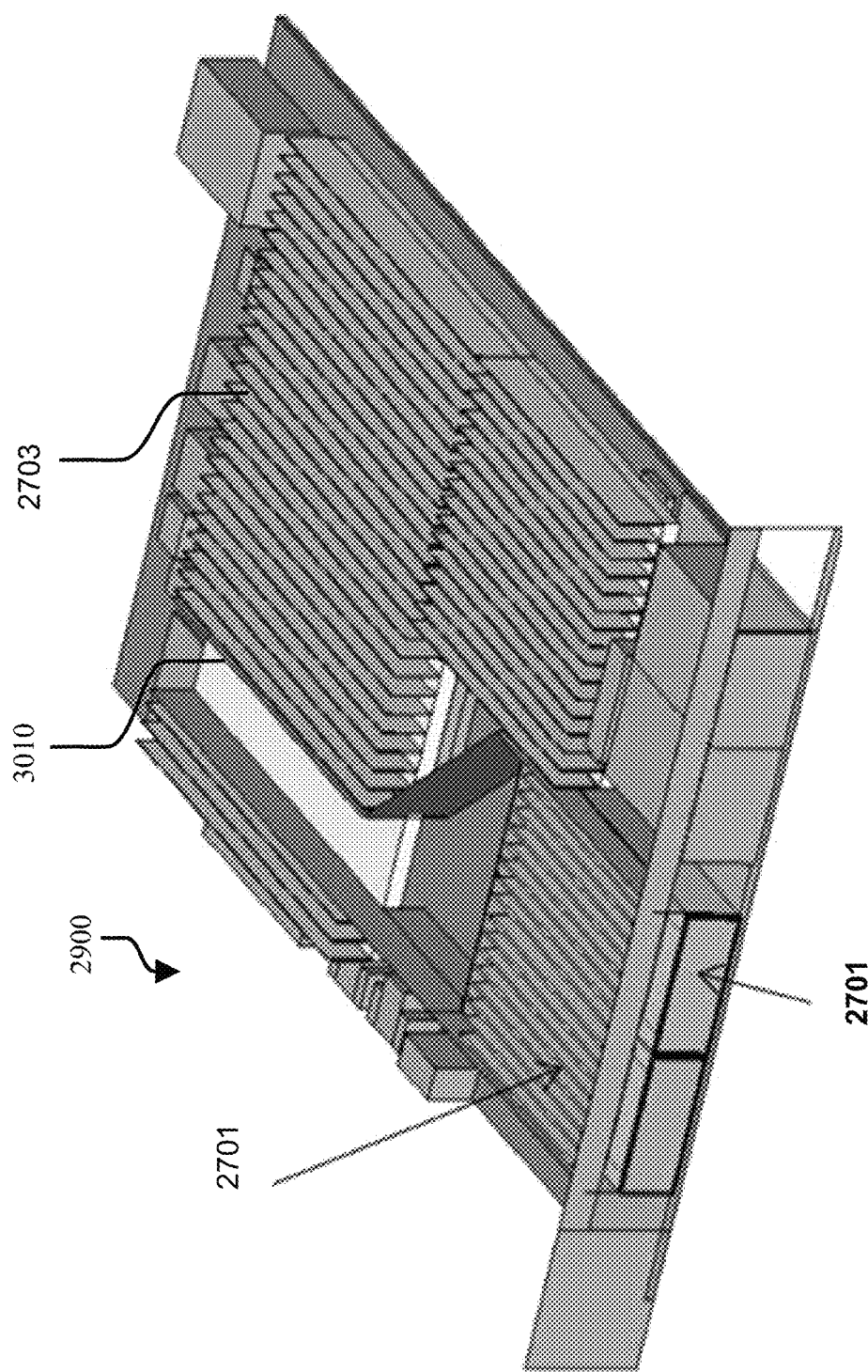
FIG. 29 shows a top front right perspective view illustration of an exemplary third I/O device comprising an exemplary baffle, per an embodiment herein.

FIG. 29 shows exemplary Device 3 2900 wherein the first downstream electrical device (DS1) 2701 and the second downstream electrical device (DS2) 2702 are adjoined, and wherein Baffle B 2910 channels the hot air from the upstream electrical device 2703 to the left of the first downstream electrical device (DS1) 2701 and the second downstream electrical device (DS2) 2702, and to an exhaust.

Figure 30:
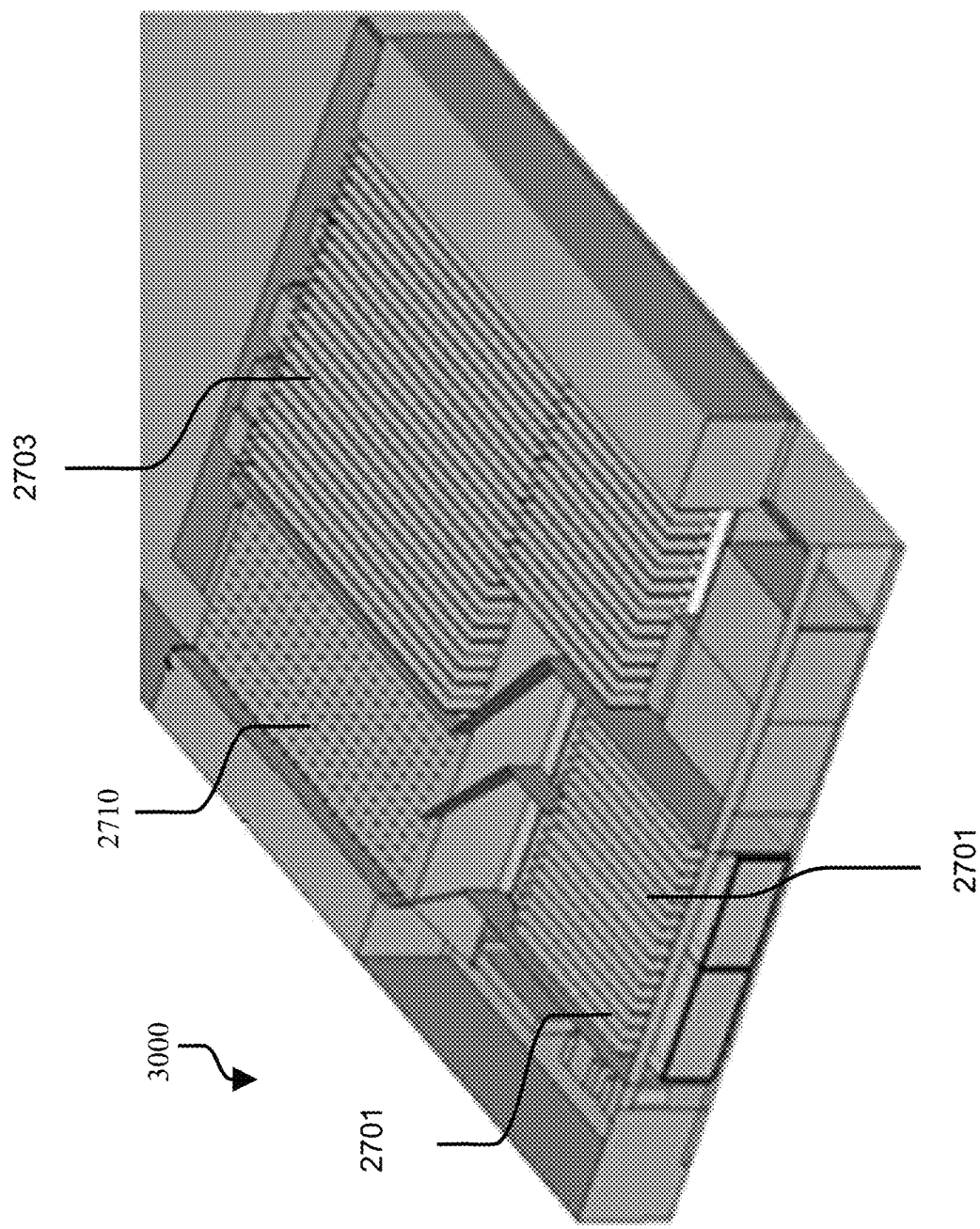
FIG. 30 shows a top front right perspective view illustration of an exemplary fourth I/O device comprising an exemplary baffle, per an embodiment herein.

FIG. 30 shows exemplary Device 4 3100 wherein the first downstream electrical device (DS1) 2701 and the second downstream electrical device (DS2) 2702 are adjoined, and wherein Baffle D 3110 is covered by a perforated sheet, which more effectively channels the hot air from the upstream electrical device 2703 to the right of the first downstream electrical device (DS1) 2701 and the second downstream electrical device (DS2) 2702, and to an exhaust.

Figure 31:
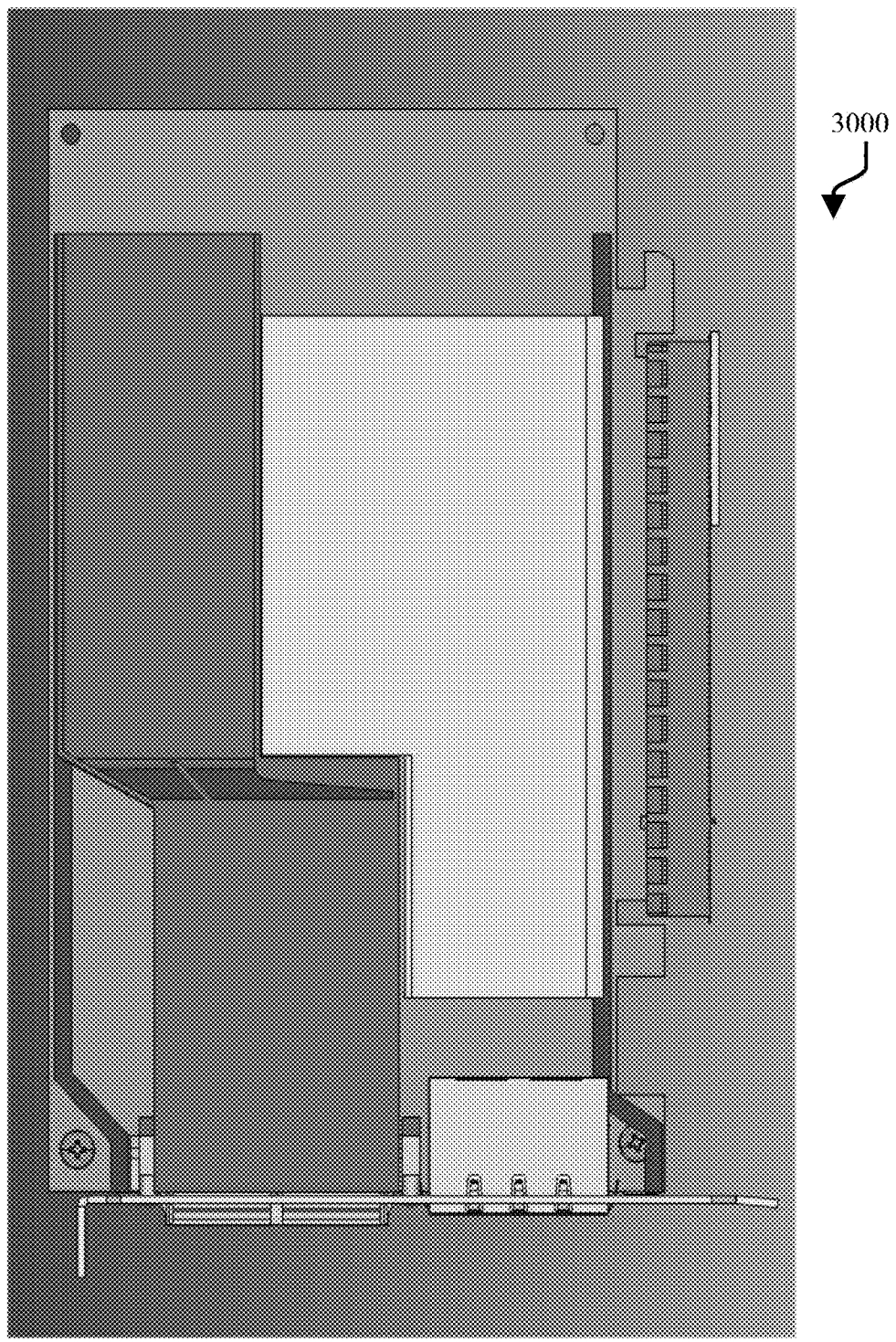
FIG. 31 shows a top plan view illustration of an exemplary fourth I/O device comprising an exemplary baffle, per an embodiment herein.
Figure 32:
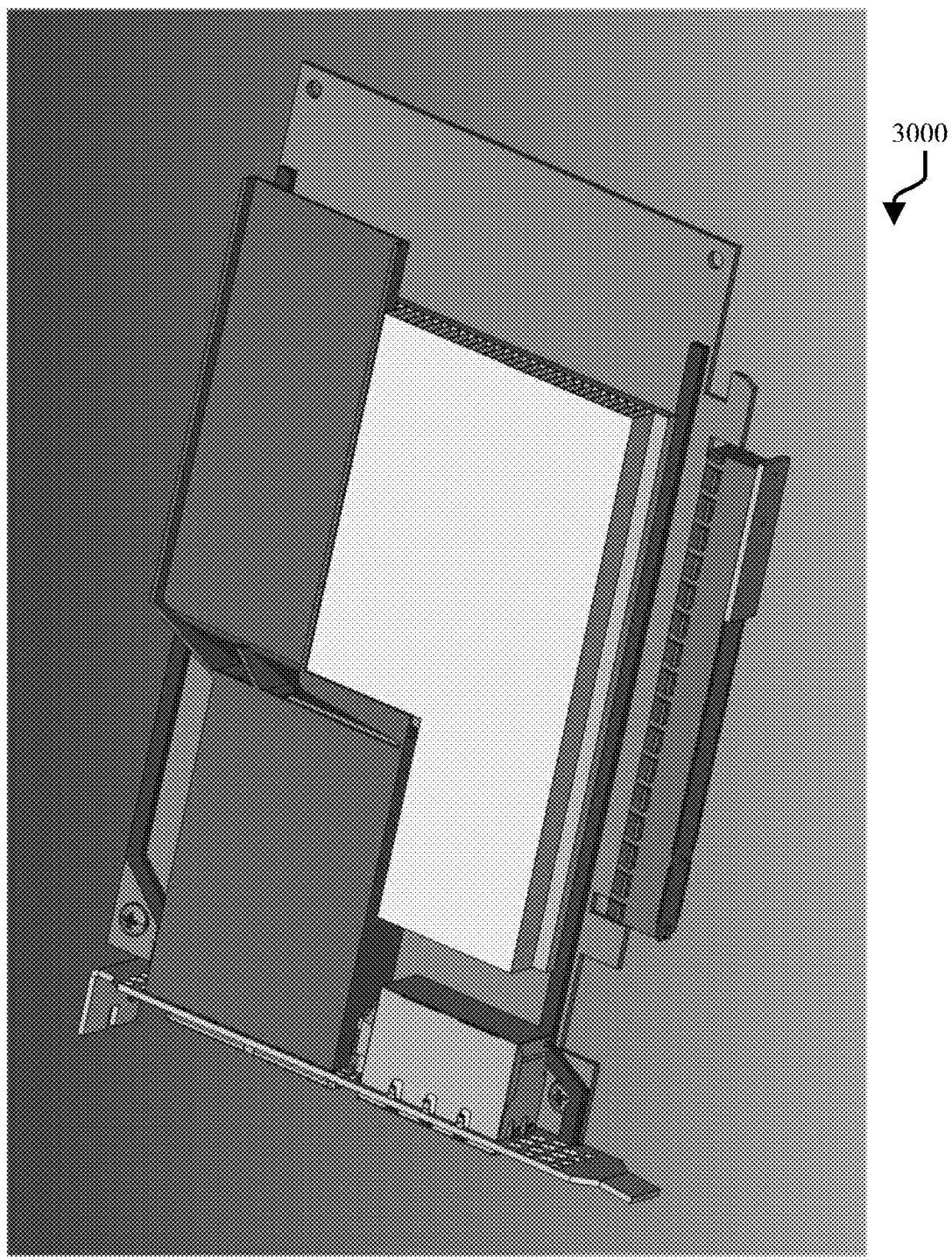
FIG. 32 shows a top right perspective view illustration of an exemplary fourth I/O device comprising an exemplary baffle, per an embodiment here.
Figure 33:
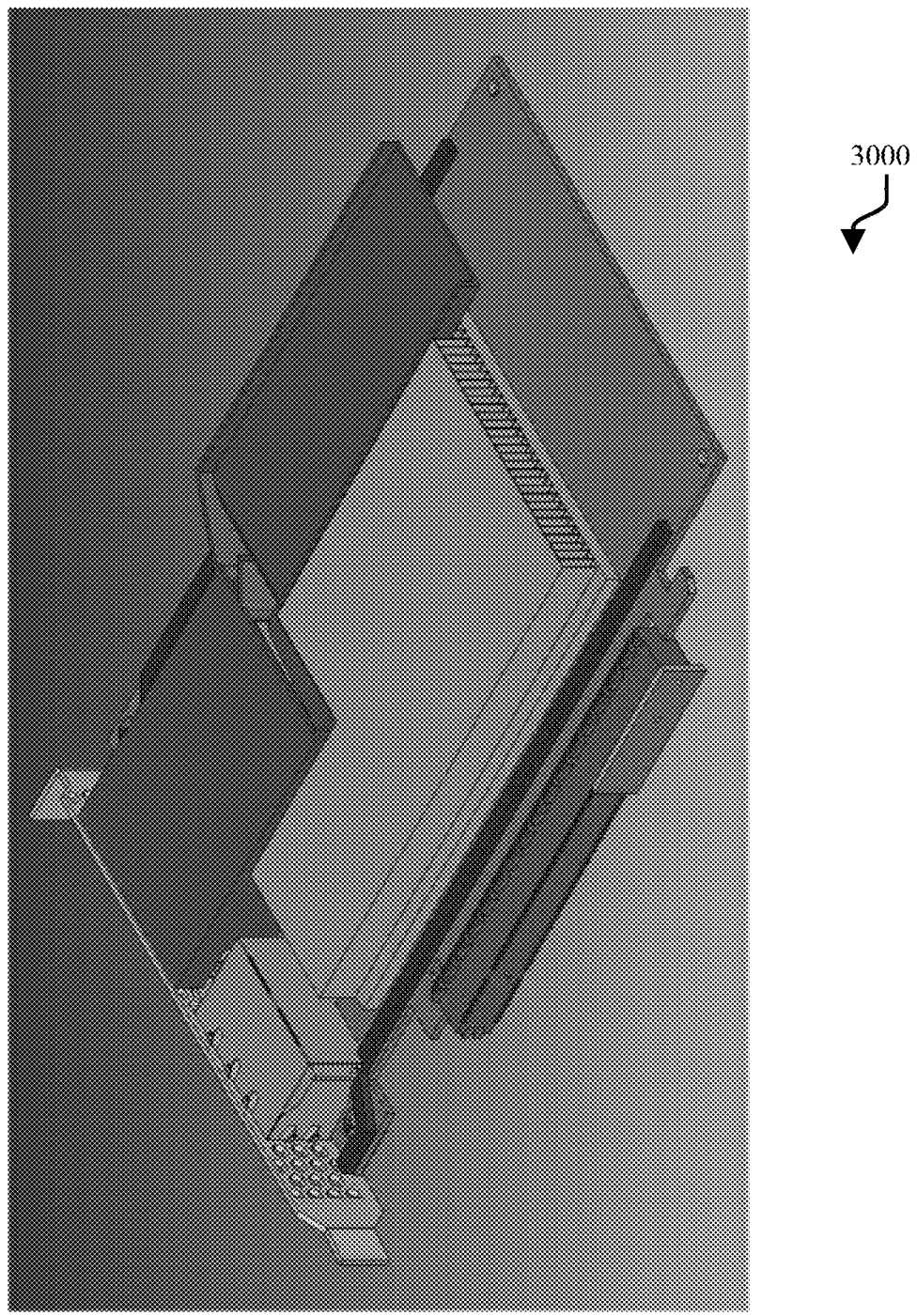
FIG. 33 shows another top right perspective view illustration of an exemplary fourth I/O device comprising an exemplary baffle, per an embodiment herein.

FIGS. 31-33 show perspective renderings of the exemplary Device 4 3000.

Simulated temperatures for Devices 1-4 were calculated per Table 1, below, wherein Device 4 with Baffle D enabled the significantly improved lower device, junction, and downstream electrical device temperatures (as bolded therein).

TABLE 1

Simulated temperatures for Devices 1-4 were calculated per Table 1, below, wherein Device 4 with Baffle D enabled the significantly improved lower device, junction, and downstream electrical device temperatures (as bolded therein).

|  | Device 1 | Device 2 | Device 3 | Device 4 |
| --- | --- | --- | --- | --- |
| Air flow (LFM) | 500 | 500 | 500 | 500 |
| Ambient temperature (C.) | 55 | 55 | 55 | 55 |
| Heat Sink Fin Type | Stacked Fin | Stacked Fin | Stacked Fin | Stacked Fin |
| Heat Sink Base Type | Extruded | Extruded | Extruded | Extruded |
| Heat Sink Size W × L × H (mm) | 81 × 105 × 11 | 86.6- × 105 × 11 | 86.6 × 105 × 11 | 86.6 ×105 × 11 |
| Face plate Vent open area (%) | 50 | 50 | 50 | 50 |
| Overall domain height (mm) | 20.32 | 20.32 | 20.32 | 17.65 |
| Baffle design | Baffle A | Baffle B | Baffle C | Baffle D |
| DS1/DS2 Power (W) | 3.5 | 3.5 | 3.5 | 3.5 |
| Device Power (W) | 59 | 59 | 59 | 59 |
| Device temperature (C.) | 96.5 | 95.7 | 97.1 | 84.7 |
| Junction Temperature (C.) | 102.1 | 101.3 | 102.7 | 90.3 |
| DS1 air temperature (C.) | 60.0 | 63.0 | 65.0 | 57.0 |
| DS1 T_case (C.) | 76.0 | 79.8 | 79.8 | 69.9 |
| DS2 air temperature (C.) | 63.3 | 65.0 | 60.0 | 57.0 |
| DS2 T_case (C.) | 79.1 | 82.0 | 77.3 | 69.5 |
| FEM T_junction max (C.) | 128.2 | 129.0 | 128.5 | 121.5 |
| heat sink base temperature, $T_{HS\text{-}base}$ (C.) |  |  | 96.5 | 84.0 |
| System pressure drop (inches_H$_2$O) | 1.5 | 1.5 | 1.5 | 1.6 |

While preferred embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure.

What is claimed is:

1. An input/output (I/O) device comprising:
    (a) an upstream electrical device comprising a first heatsink that emits heat;
    (b) a downstream electrical device comprising a second heatsink; and
    (c) a baffle for redirecting a predetermined portion of a fluid entering the I/O device around the upstream electrical device and the first heatsink through the downstream electrical device and the second heatsink and to an exhaust, the baffle comprising:

(i) a first portion comprising a fluid inlet, wherein at least a portion of the fluid inlet is upstream of the upstream electrical device and the first heatsink; and (ii) a second portion comprising a fluid outlet, wherein at least a portion of the fluid outlet surrounds at least a portion of the downstream electrical device and the second heatsink;

wherein the baffle provides an airflow path from the first portion to the second portion such that the downstream electrical device and the second heatsink is isolated from the heat emitted by the upstream electrical device and the first heatsink, and wherein a pressure of the fluid at the fluid inlet is greater than the pressure of the fluid at the fluid outlet.

2. The I/O device of claim 1, wherein the fluid comprises air, a gas, water, or a liquid.

3. The I/O device of claim 1, wherein the pressure of the fluid at the fluid inlet is greater than the pressure of the fluid at the fluid outlet by about 0.75 inches of water gauge (iwg) to about 3 iwg.

4. The I/O device of claim 1, wherein the first portion is offset from the second portion in one or more directions.

5. The I/O device of claim 1, wherein an interior of at least one of the first portion and the second portion comprises a fluid redirection fin.

6. The I/O device of claim 1, wherein a temperature of the fluid at the fluid inlet is about 25° C. to about 75° C.

7. The I/O device of claim 1, wherein an upper surface of the first portion, the second portion or both, comprises a perforation.

8. The I/O device of claim 1, wherein an upper surface of the first portion, the second portion or both, is removable.

9. The I/O device of claim 1, having a ratio between an area of the fluid inlet and an area of the fluid outlet is about 0.1:1 to about 10:1.

10. The I/O device of claim 1, having a ratio between a volume the first portion and a volume the second portion of about 0.1:1 to about 10:1.

11. The I/O device of claim 1, having a ratio between a height of the fluid inlet and a height of the fluid outlet is about 0.1:1 to about 10:1.

12. The I/O device of claim 1, wherein the predetermined portion of the fluid entering the I/O device is at least 20%.

13. The I/O device of claim 12, wherein the predetermined portion of the fluid entering the I/O device is at least 50%.

* * * * *